(12) United States Patent
Miyazaki

(10) Patent No.: US 9,099,466 B2
(45) Date of Patent: Aug. 4, 2015

(54) SEMICONDUCTOR DEVICE AND MANUFACTURING METHOD THEREOF

(71) Applicant: Renesas Electronics Corporation, Kawasaki-shi, Kanagawa (JP)

(72) Inventor: Toshihiko Miyazaki, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/070,949

(22) Filed: Nov. 4, 2013

(65) Prior Publication Data

US 2014/0125421 A1    May 8, 2014

(30) Foreign Application Priority Data

Nov. 8, 2012    (JP) ................................. 2012-246458

(51) Int. Cl.

| | |
|---|---|
| H01L 23/52 | (2006.01) |
| H01L 23/522 | (2006.01) |
| H01L 23/532 | (2006.01) |
| H01L 23/528 | (2006.01) |
| H01L 27/115 | (2006.01) |
| H01L 49/02 | (2006.01) |
| H01L 21/768 | (2006.01) |

(52) U.S. Cl.
CPC ........ *H01L 23/5228* (2013.01); *H01L 23/5283* (2013.01); *H01L 23/53238* (2013.01); *H01L 27/11573* (2013.01); *H01L 28/24* (2013.01); *H01L 21/76834* (2013.01); *H01L 21/76852* (2013.01); *H01L 21/76885* (2013.01); *H01L 2924/0002* (2013.01)

(58) Field of Classification Search
CPC .................................................... H01L 23/5228
USPC ................... 257/537; 438/385; 331/108 C
See application file for complete search history.

(56) References Cited

U.S. PATENT DOCUMENTS

| | | | |
|---|---|---|---|
| 7,082,293 B1 * | 7/2006 | Rofougaran et al. | 455/260 |
| 7,190,045 B2 | 3/2007 | Egashira et al. | |
| 2011/0180901 A1 | 7/2011 | Matsumura | |
| 2012/0075029 A1 * | 3/2012 | Sekine et al. | 331/108 C |

FOREIGN PATENT DOCUMENTS

| | | | |
|---|---|---|---|
| JP | 2004-303908 A | 10/2004 | |
| JP | 2011-155192 A | 8/2011 | |

\* cited by examiner

*Primary Examiner* — Joseph Chang
(74) *Attorney, Agent, or Firm* — Foley & Lardner LLP

(57) ABSTRACT

Provided are a semiconductor device including an oscillator and a manufacturing method thereof, in which cost is low and design flexibility is high. The semiconductor device includes a wiring structure region and an oscillator region. The semiconductor device also includes, in the oscillator region, a metal resistive element as the same layer as a conducting film over uppermost metal wiring in the wiring structure region.

7 Claims, 20 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2012-246458 filed on Nov. 8, 2012 including the specification, drawings and abstract is incorporated herein by reference in its entirety.

BACKGROUND

The present invention relates to a semiconductor device and a manufacturing method thereof, and in particular, to a semiconductor device having a metal resistive element and a manufacturing method thereof.

Microcontroller products and oscillators have been structured separately from each other before, but in recent years, oscillators are embedded in microcontroller chips in order to reduce layout areas and cost, etc. In order to embed an oscillator in a microcontroller chip, it is needed to output stable oscillating frequencies under any environment (voltage, temperature), and it is required to achieve, for example, 40 MHz±1% as a target accuracy in a high-speed OCO (On Chip Oscillator) circuit of a microcontroller product.

In order to achieve the aforementioned target accuracy, it is desirable to adopt titanium nitride (TiN) in a resistive element for a constant current generation circuit in a high-speed OCO circuit that is an analog circuit of an oscillator. One reason why TiN is adopted is that, because a so-called piezo-resistance effect is not generated in TiN, a variation in resistance values, occurring due to the stress resulting from a piezo-resistance effect, is small. The accuracy in oscillating frequencies can be enhanced with a variation in resistance values being reduced. Another reason for this is that, because the temperature dependence of a resistance value in a circuit using TiN is appropriate in a silicon process, TiN is suitable for being used as a so-called barrier metal covering the upper and lower surfaces of wiring. Resistive elements using TiN are disclosed, for example, in Japanese Unexamined Patent Publication No. 2011-155192 (Patent Document 1) and Japanese Unexamined Patent Publication No. 2004-303908 (Patent Document 2).

PATENT DOCUMENTS

[Patent Document 1] Japanese Unexamined Patent Publication No. 2011-155192

[Patent Document 2] Japanese Unexamined Patent Publication No. 2004-303908

SUMMARY

For example, when TiN is used in a resistive element for a constant current generation circuit in a high-speed OCO circuit, as in Patent Document 1, there sometimes occurs the problem that the manufacturing process becomes complicated. TiN is used in a resistive element for an oscillator, and can be used as a barrier metal for the wiring in a multi-layer wiring structure by which a memory and a logic circuit, which form a microcontroller product, are formed. However, when a thin film of TiN, as a resistive element for an oscillator, and that as a barrier metal are formed in different steps, the process becomes long, which causes an increase in cost.

In Patent Document 2, a thin film of TiN as a barrier metal for an MIM type capacitive element and that as a resistive element for a resistive electrode independent of the MIM type capacitive element are formed as the same layer. Thereby, the process for forming the thin films of TiN is reduced. However, the thin film of TiN is formed as a barrier metal covering the lower surface of the electrode or a resistive element. In this case, it is difficult to control the thickness of the thin film of TiN, and hence there is the possibility that design flexibility may be lowered.

Other problems and new features will become clear from the description and accompanying drawings of the present specification.

According to one embodiment, a semiconductor device includes a wiring structure, a conducting film over uppermost metal wiring, and a metal resistive element. The metal resistive element is formed by the same layer as the conducting film over uppermost metal wiring.

According to a manufacturing method of another embodiment, a plurality of layers of metal wirings are first formed. A conducting film is then formed, the film extending from the upper surface of the uppermost metal wiring that is the uppermost layer the metal wirings to an interlayer film arranged in contact with the lower face of the uppermost metal wiring. The conducting film is separated into the conducting film over uppermost metal and the metal resistive element by being patterned.

According to the one embodiment, the thickness of a metal resistive element layer, as the same layer as the conducting film over metal wiring, can be easily controlled in a semiconductor device, thereby allowing design flexibility to be improved.

According to the another embodiment, the process of the manufacturing method of a semiconductor device can be reduced, thereby allowing cost to be reduced.

DETAILED DESCRIPTION

Hereinafter, one embodiment will be described based on the accompanying drawings.

First Embodiment

A configuration of a semiconductor device according to one embodiment will be first described by using FIGS. 1 to 5.

Figure 1:
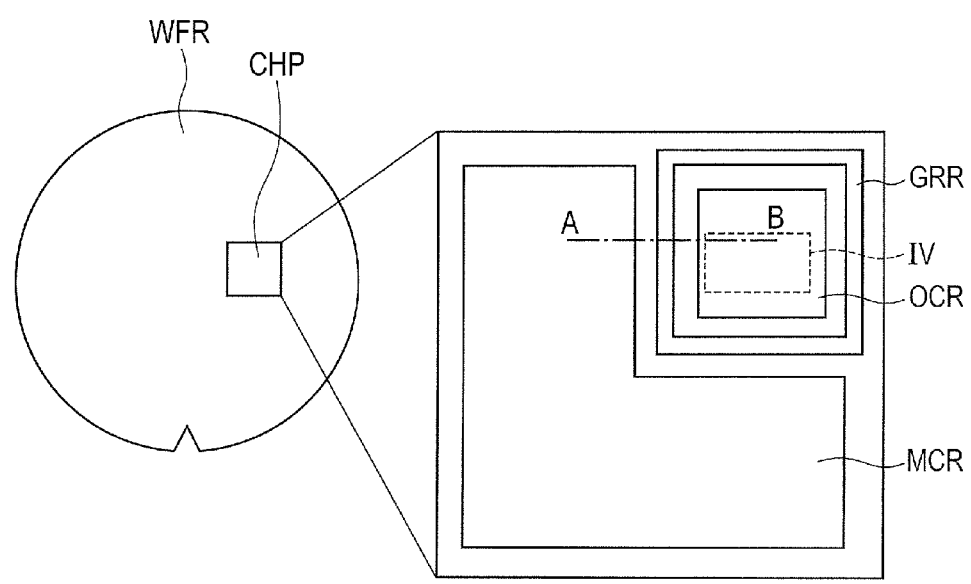
FIG. 1 is a schematic view for explaining a semiconductor chip according to First Embodiment.

With reference to FIG. 1, a semiconductor device according to one embodiment is formed as a semiconductor chip CHP cut off as part of a semiconductor wafer WFR. The main body of the semiconductor chip CHP is a semiconductor substrate having a main surface made, for example, of single crystalline silicon. A wiring structure region MCR, an oscillator region OCR, and a guard ring formation region GRR are formed over the main surface of the semiconductor chip CHP.

The wiring structure region MCR means a region where an integrated circuit (microcontroller product) having a so-called CPU (Central Processing Unit), a memory, and an input/output circuit, etc., is arranged in the single semiconductor chip CHP, the region being referred, for example, to as a so-called MCU (Micro-Control Unit). A so-called (multi-layer) wiring structure is formed in the wiring structure region MCR, the wiring structure being electrically coupled to the aforementioned integrated circuit (microcontroller product) by at least one layer (normally, a plurality of layers) of metal wiring(s).

The oscillator region OCR means a region where a high-speed OCO circuit (as an oscillator) of a microcontroller product is arranged, the oscillator region OCR being arranged over the main surface of the semiconductor chip CHP so as to be located side by side with the wiring structure region MCR. The guard ring formation region GRR moms a region where a guard ring, by which the wiring structure region MCR and the oscillator region OCR are made independent of each other (guarded against each other) over the substrate of the semiconductor chip CHP, is arranged.

As an example, the oscillator region OCR having a rectangular shape is arranged, in planar view, in part (e.g., in an upper right region) of the semiconductor chip CHP, and the wiring structure region MCR is arranged, in planar view, in a region other than the oscillator region OCR. The guard ring formation region GRR is arranged between the wiring structure region MCR and the oscillator region OCR so as to surround the oscillator region OCR from the outside thereof.

Figure 2:
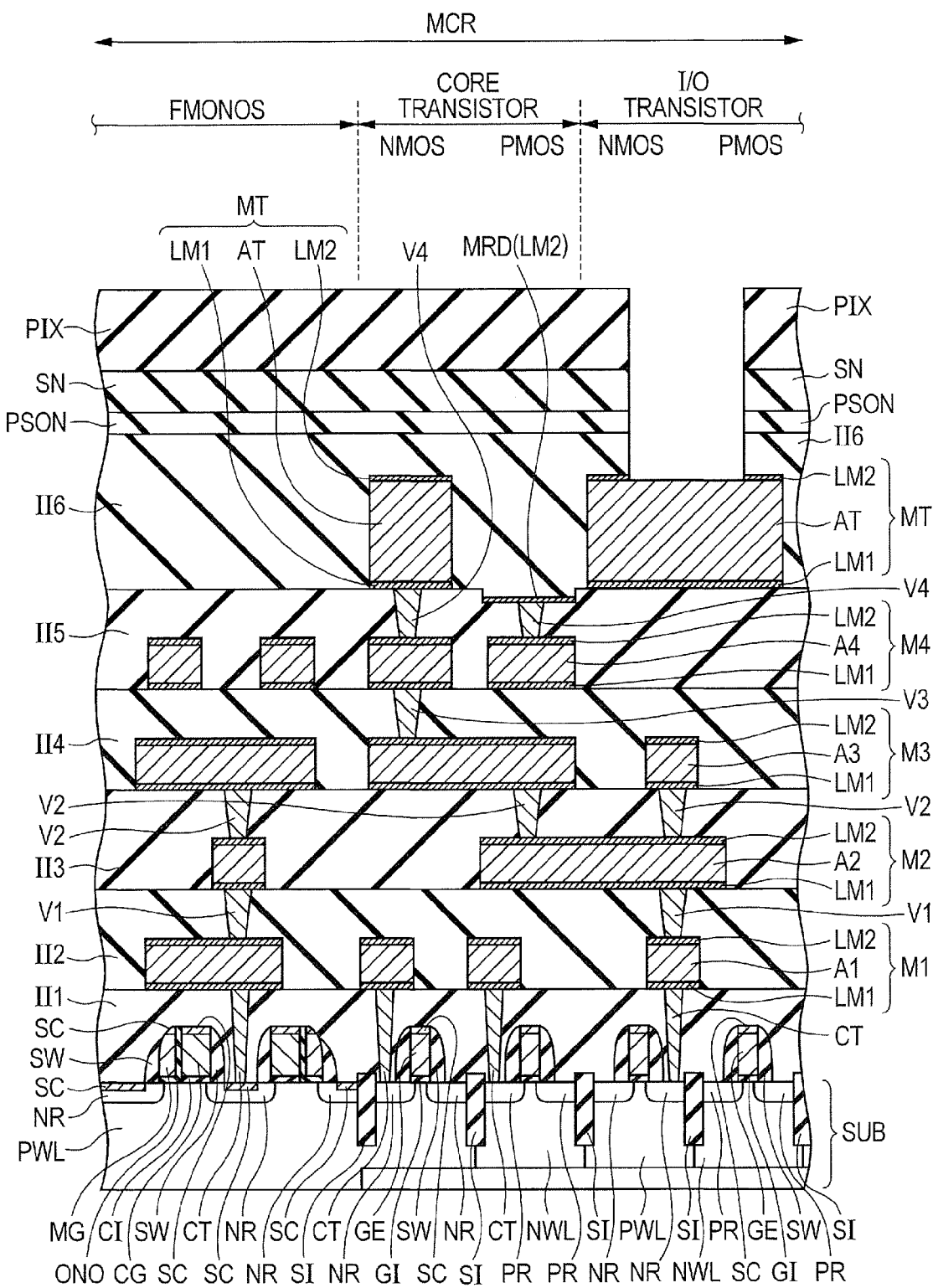
FIG. 2 is a schematic sectional view illustrating a configuration of an integrated circuit and a multi-layer wiring structure that form a microcontroller product according to First Embodiment.

Subsequently, an integrated circuit and a multi-layer wiring structure will be described with reference to FIG. 2. With reference to FIG. 2, a so-called multi-layer wiring structure including, for example, an MCU is formed in the wiring structure region MCR. Specifically, at least one layer (normally, a plurality of layers) of the metal wirings A1 to AT of the later-described wiring layer is (are) arranged in the wiring structure region MCR. Herein, five layers including both the metal wirings A1 to A4 and the metal wiring AT are formed, each of the five layers being arranged so as to make a multi-layer by being laminated one over another.

A so-called FMONOS type memory (denoted with "FMONOS" in the view) having both a memory function and a control function, a core transistor as a logic circuit, and an I/O transistor as input/output circuit are arranged ever the main surface of the semiconductor substrate SUB in the wiring structure region MCR, those three components forming an integrated circuit.

Each of the FMONOS type memory, core transistor, and I/O transistor is formed over the main surface of the semiconductor substrate SUB. At first, the FMONOS type memory mainly has an n-type impurity region NR, a memory gate insulating film ONO, a memory gate electrode MG, a control gate insulating film CI, a control gate electrode CG, and a sidewall insulating film SW.

A P-type well region PWL is arranged over the main surface of the semiconductor substrate SUB, and a pair of the n-type impurity regions NR are arranged in the P-type well region PWL so as to be spaced apart from each other as a source region and a drain region, respectively. Both a memory gate comprised of the memory gate insulating film ONO and the memory gate electrode MG and a control gate comprised of the control gate insulating film CI and the control gate electrode CG are formed such that both the gates are sandwiched by the pair of the n-type impurity regions NR.

The memory gate and the control gate are arranged so as to be adjacent with each other. Of them, the memory gate insulating film ONO that forms the memory gate is formed so as to contact a side surface of the control gate and to have an extension part that extends up to over the main surface of the semiconductor substrate SUB. The memory gate insulating film ONO has a three-layer structure in which, for example, a silicon dioxide film, a silicon nitride film, and a silicon dioxide film are laminated in this order. The memory gate electrode MG is formed so as to contact both the surface of a region that contacts the side surface of the control gate in the memory gate insulating film ONO and the upper surface of the extension part.

On the other hand, the control gate electrode CG is formed over the main surface of the semiconductor substrate SUP sandwiched by the pair of the n-type impurity regions NR, so that the control gate insulating film CI that is comprised, for example, of a silicon dioxide film is interposed between the control gate electrode CG and the main surface SUB.

Each of the core transistor and the I/O transistor is a so-called CMOS (Complementary Metal Oxide Semiconductor) transistor in which an n-type MOS (Metal Oxide Semiconductor) transistor and a p-type MOS transistor are combined. That is, the n-type MOS (NMOS) transistor mainly has the n-type impurity region NR, a gate insulating film GI, a gate electrode GE, and the sidewall insulating film SW.

The pair of the n-type impurity regions NR are formed, as a source region and a drain region, respectively, in the p-type well region PWL over the main surface of the semiconductor substrate SUB. A gate comprised of the gate insulating film GI and the gate electrode GE is formed so as to be sandwiched by the pair of the n-type impurity regions NR. The gate insulating film GI is a pattern of, for example, a silicon thermally-oxidized film formed over the main surface of the semiconductor substrate SUB.

The p-type MOS (PMOS) transistor is different from the n-type MOS transistor in that: the p-type MOS transistor is formed in an n-type well region NWL and has a pair of p-type impurity regions PR, but is similar to the n-type MOS transistor in other points.

Each of the gate electrodes CG, MG, and GE in the FMONOS type memory, the core transistor, and the I/O transistor is comprised of a conductive material, such as polycrystalline silicon, a metal film, or the like. In addition, as silicide layer SC may be formed over the upper surfaces of the impurity regions NR and PR and the upper surfaces of the gate electrodes MC, CG, and GE. The sidewall insulating film SW comprised, for example, of a silicon dioxide film is formed over side walls of the gate electrodes MC, CG, and GE. Each of the FMONOS type memory, the NMOS, and the PMOS is electrically separated from each other by an isolation insulating film SI comprised, for example, of a silicon dioxide film, which is formed over the main surface ct the semiconductor substrate SUB.

Interlayer insulating films II1, II2, II3, II4, and II6, each of which is comprised, for example, of a silicon dioxide film, are laminated over the main surface of the semiconductor substrate SUB over which these transistors (FMONOS, NMOS, and PMOS) are formed. Herein, six layers of the interlayer insulating films II1 to II6 are formed as an example, but the number of the laminated interlayer insulating films is arbitrary.

Wiring layers M1, M2, M3, M4, and MT are formed so as to contact the upper surfaces of the interlayer insulating films II1, II2, II3, II4, and II5, respectively. Herein, the wiring layer MT is the uppermost wiring layer of the wiring layers M1 to MT.

The wiring layer M1 is formed by the metal wiring A1, a laminated film LM1 in contact with the lower surface of the metal wiring A1, and a laminated film LM2 in contact with the upper surface thereof. Similarly, the wiring layers M2 to M4 are formed by metal wirings to A2 to A4, laminated films LM1 in contact with the lower surfaces of the metal wirings A2 to A4, and laminated films LM2 in contact with the upper surfaces thereof, respectively; and the uppermost wiring layer MT is formed by the uppermost metal wiring AT, a laminated film LM1 in contact with the lower surface of the metal wiring AT, and a laminated film LM2 in contact with the upper surface thereof. The laminated films LM1 and LM2 will be described in detail later.

Each of the impurity regions NR and PR in each transistor is electrically coupled to the wiring layer M2 via a contact CT. Each of the wiring layers M1 to MT is electrically coupled to each other by vias V1, V2, V3, and V4, respectively. Each of the contacts CT and the vias V1 to V4 is formed by tungsten with which a via hole formed, for example, in part of the interlayer insulating film is filled.

In FIG. 2, an example is illustrated, in which, for example, an HDP oxide film PSON, a silicon nitride film SN, and a passivation film PIX are laminated in this order so as to cover the upper surface of an interlayer insulating film 116. In order to be electrically coupled to an external circuit, etc., part of the upper surface of the uppermost metal wiring AT is exposed in the region where the I/O transistor is formed.

The laminated film LM2, which forms the uppermost wiring layer MT in the wiring structure region MCR, is formed as the same layer as a metal resistive element MRD to be used in a circuit including, in the oscillator region OCR in FIG. 1, an oscillator, such as a high-speed OCO circuit. In other words, the metal resistive element layer (part of the metal resistive element MRD) is formed by the same layer as the conductive film covering the upper surface of the uppermost metal wiring AT in the wiring structure region MCR (herein, conductive film corresponding to part of the laminated film LM2 covering the upper surface of the uppermost metal wiring AT).

In order to illustrate this in FIG. 2, the laminated film LM2, in contact with the upper surface of the uppermost metal wiring AT in the region where the I/O transistor is formed, extends from over the side surface on the left side of the uppermost metal wiring AT to the upper surface of the via V4 in the region where the core transistor is formed, while being bent, so that the laminated film LM2 contacts the upper surface of the via V4 in the region where the core transistor is formed.

FIG. 2 described above illustrates, of the semiconductor chip CHP in FIG. 1, only a configuration in the wiring structure region MCR. However, FIG. 3 illustrates the configuration of the semiconductor chip CHP including the guard ring formation region GRP and the oscillator region OCR in addition to the aforementioned wiring structure region MCR.

Figure 3:
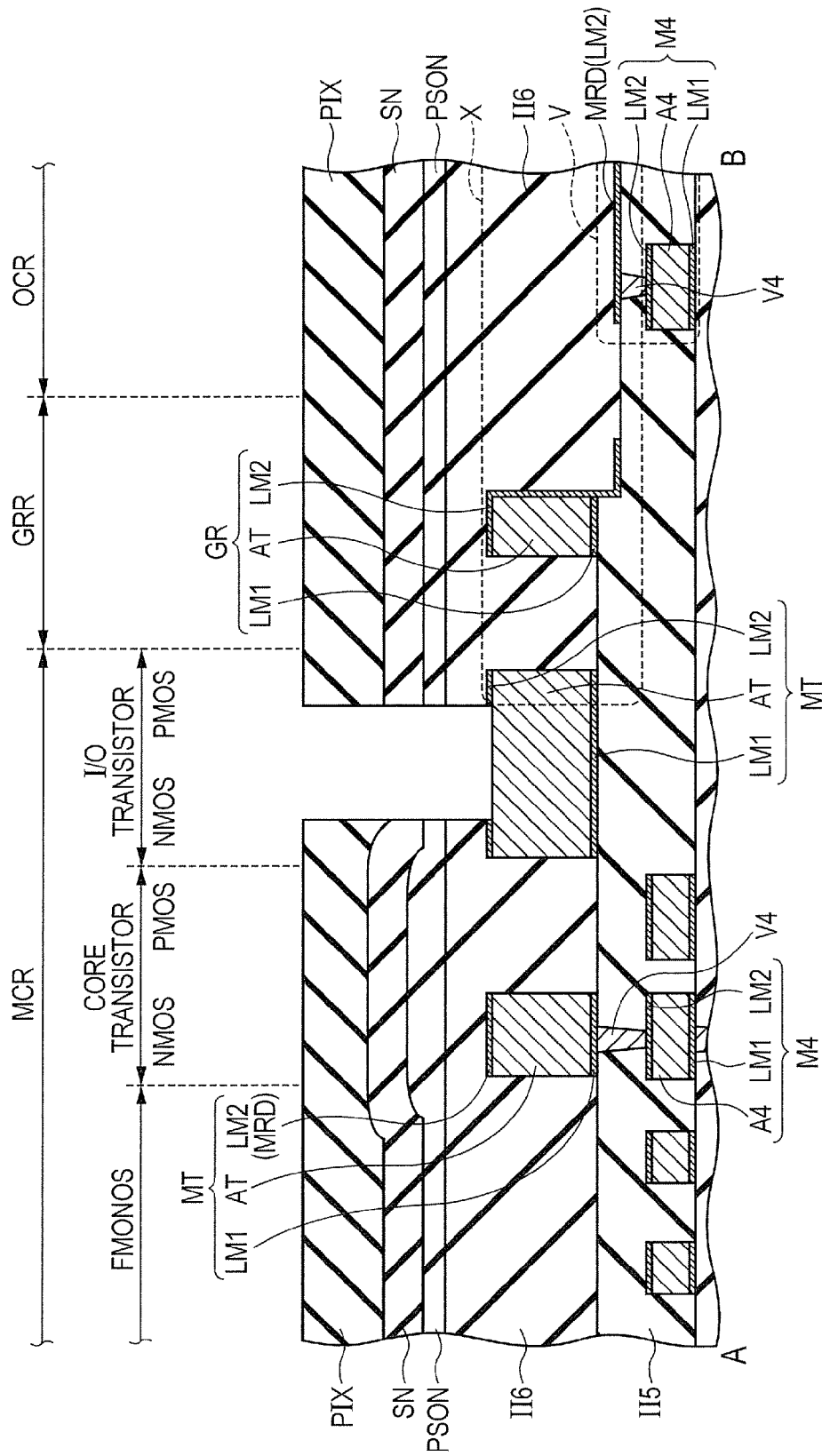
FIG. 3 is a schematic sectional view illustrating a configuration including a wiring structure region, a guard ring formation region, and an oscillator region which are illustrated in FIG. 2.

With reference to FIG. 3, the view illustrates the sectional configuration of a region along A-B Line in FIG. 1, in which the configuration of the multi-layer wiring structure in the wiring structure region MCR, the guard ring for formation region GRR, and the oscillator region OCR. However, illustration of the layers under the interlayer insulating film II4 is omitted in FIG. 3.

A guard ring GR is formed in the guard ring formation region GRR, which is formed by the uppermost metal wiring AT, the laminated film LM1 in contact with the lower surface of the uppermost metal wiring AT, and the laminated film LM2 in contact with the upper surface thereof. Each of the uppermost metal wiring AT and the laminated films LM1 and LM2 in the guard ring formation region GRR is arranged as the same layer as each of the uppermost metal wiring AT, the laminated films LM1 and LM2 in the wiring structure region MCR.

The laminated film LM2, as the same layer as the laminated film LM2 in each of the wiring structure region MCR and the guard ring formation region GRR, is arranged in the oscillator region OCR as the metal resistive element MRD. However, layers that are the same as the uppermost metal wiring AT and the laminated film LM1 in, for example, the wiring structure region MCR are not arranged in the oscillator region OCR.

More specifically, the interlayer insulating film II5, over which the uppermost wiring layer MT is formed, has a shape with a step that is obtained by being dug a bit deeply in the downward direction in the guard ring formation region ORR between the wiring structure region MCR and the oscillator region OCR. Accordingly, the laminated film LM2 that forms the guard ring CR extends from over the upper surface of the uppermost metal wiring AT to over the upper surface of the interlayer insulating film II5 that is a bit deep in the downward direction, through the side surface of the uppermost metal wiring AT. Thus, an aspect in which (the upper surface of) the interlayer insulating film II5 is deeply dug in the downward direction continues up to the oscillator region OCR adjacent to the guard ring formation region GRR. Accordingly, the laminated film LM2 is arranged at a position lower than that of the wiring structure region MCR in the oscillator region OCR. Herein, it is desirable that the laminated film LM2 (metal resistive element MRD) in at least the oscillator region OCR is arranged at a position lower than that of the laminated film LM2 over the upper surface of the uppermost metal wiring AT in the wiring structure region MCR.

In fact, however, the metal resistive element MRD, as the same layer as the laminated film LM2 covering the upper surface of the uppermost metal wiring AT in the region where the core transistor in the wiring structure region MCR is formed, is arranged in the region where the core transistor is formed in FIG. 2. This is because the laminated film LM2 is actually formed so as to be drawn around from the oscillator region OCR to the wiring structure region MCR (region where the core transistor is formed) just under the guard ring formed between both the regions.

Subsequently, the metal resistive element in the oscillator region OCR will be described in more detail with reference to FIGS. 4 and 5.

Figure 4:
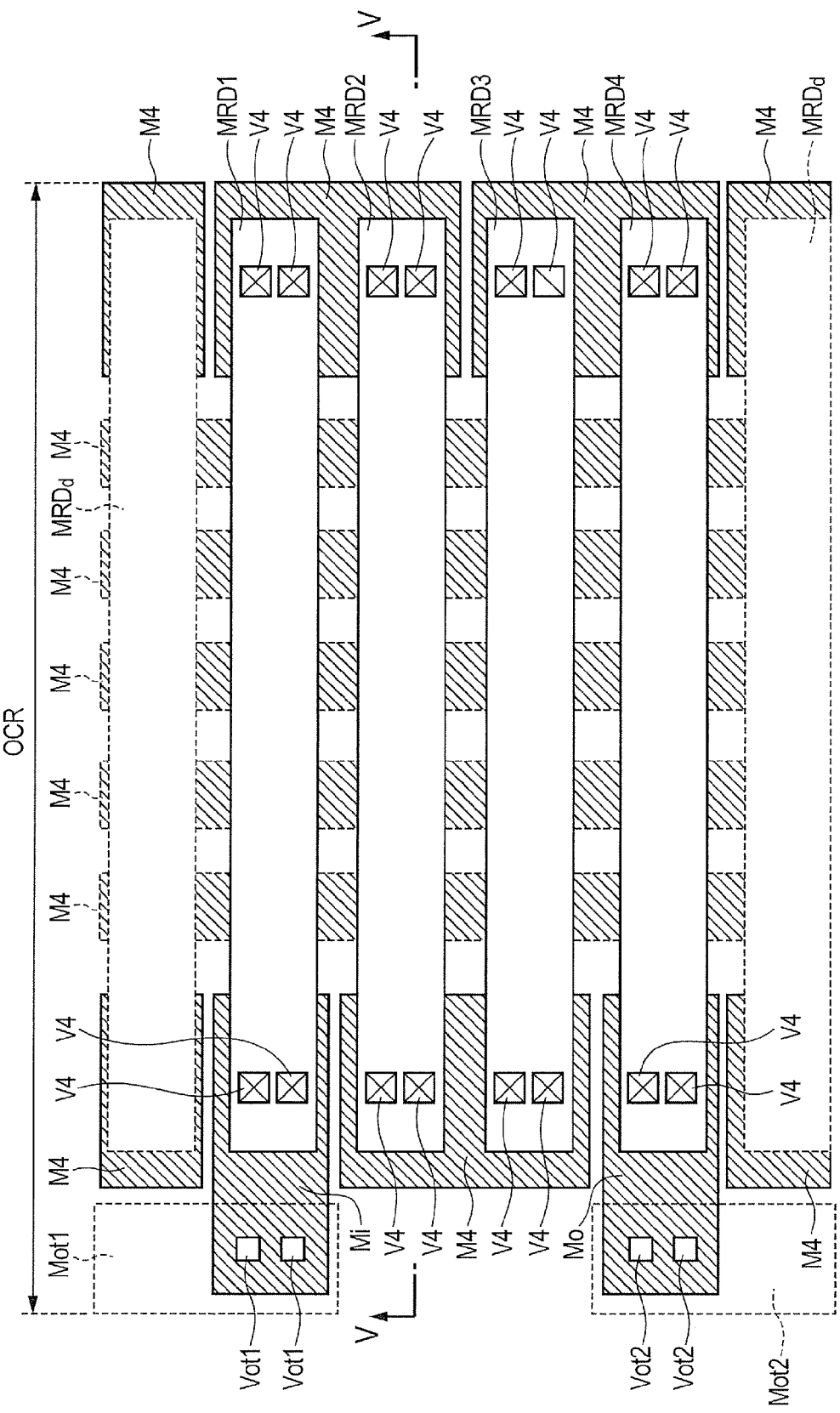
FIG. 4 is a schematic plan view illustrating a configuration a metal resistive element in the oscillator region.

FIG. 4 illustrates, in planar view, an aspect of a region IV enclosed by a dotted line in FIG. 1. With reference to FIG. 4, the metal resistive elements MRD in FIGS. 2 and 3 are metal resistive elements in the oscillator region OCR (high-speed OCC circuit), which are indicated by metal resistive elements MRD1, MRD2, MRD3, and MRD4 in FIG. 4. A plurality of (four in FIG. 4) metal resistive elements are normally arranged so as to extend in the horizontal direction of FIG. 4 and to be spaced apart from each other with respect to a direction along the main surface of the semiconductor substrate SUB. Each of the metal resistive elements MRD (MRD1 to MRD4) is electrically coupled to an underlying wiring layer M4 via the via V4 at both the end portions with respect to the direction in which the each of the elements MRD extends. In addition, in order to enhance the accuracy in processing the patterns of the metal resistive elements MDR1 to MRD4, dummy metal resistive elements MRDd, as the same layers as the metal resistive elements MRD1 to MRD4, are arranged near to the metal resistive elements MRD1 to MRD4. Each of the dummy metal resistive elements MRDd has a laminate configuration similar to that of each of the metal resistive elements MRD1 to MRD4.

The wiring layers M4, which are electrically coupled to each other via the metal resistive elements MRD1 to MRD4 and the vies V4, form a single and long current pathway by electrically coupling the metal resistive elements MRD (MRD1 to MRD4) to each other, the metal resistive elements MRD standing in line in the vertical direction of the view, in which a current flows in a zigzag manner by alternately combining a current pathway oriented from left to right in the view and that oriented from right to left therein.

Specifically, a current pathway to be coupled to the OCC circuit first communicates from another conducting film Mot1, which is a conducting film formed as the same layer as the wiring layer M3 in, for example, FIG. 2, to an input wiring layer Mi that is a conducting film formed as the same layer as the wiring layer M4 via another via Vot1. Subsequently, the current pathway communicates from the input wiring layer Mi to the metal resistive element MRD1 via the via V4, and communicates to the wiring layer M4 via the via V4 on the right side of the metal resistive element MRD1 by flowing through the metal resistive element MRD1 from left to right. Further, the current pathway communicates from the wiring layer M4 to the metal resistive element MRD2 via the via V4, and communicates to the wiring layer M4 via the via V4 on the left side of the metal resistive element MRD2 by flowing through the metal resistive element MRD2 from right to left. Similarly, the current pathway then communicates from the wiring layer M4 to the metal resistive element MRD3 via the via V4, and reaches the wiring layer M4 from the via V4 on the right side by flowing right through the metal resistive element MRD3. Subsequently, the current pathway communicates from the wiring layer M4 to the metal resistive element MRD4 via the via V4, and reaches an output wiring layer Mo from the via V4 on the left side by flowing left through the metal resistive element MRD4. The current pathway reaches another conducting film Mot2, which is a conducting film formed as the same layer as the wiring layer M3 in, for example, FIG. 2, from the output wiring layer Mo via another via Vot2. Herein, the conducting films Mot1 and Mot2 are electrically coupled, for example, to external circuits.

On the other hand, resistors, etc., which are part of the OCO circuit, are illustrated in, for example, FIG. 4. In addition, a current pathway, extending in the vertical direction of FIG. 4 so as to pass just under, for example, the metal resistive elements MRD1 to MRD4, is present in the wiring layer M4 in addition to that electrically coupled to the metal resistive elements MRD as described above.

In FIG. 4, a plurality of (herein, five) wiring layers M4, which are not coupled to the metal resistive elements MRD via the vias V4 and are formed as the same layer as the wiring layer M4, are arranged so as to extend in the vertical direction of FIG. 4 and to be spaced apart from each other.

The metal resistive elements MRD1 to MRD4 are arranged as resistive elements for the aforementioned long current pathway in the OCO circuit. As described above, each of the metal resistive elements MRD1 to MRD4 (MRD) is formed as the same layer as the laminated film LM2 covering the upper surface of the uppermost metal wiring AT of the wiring layer MT.

Figure 5:
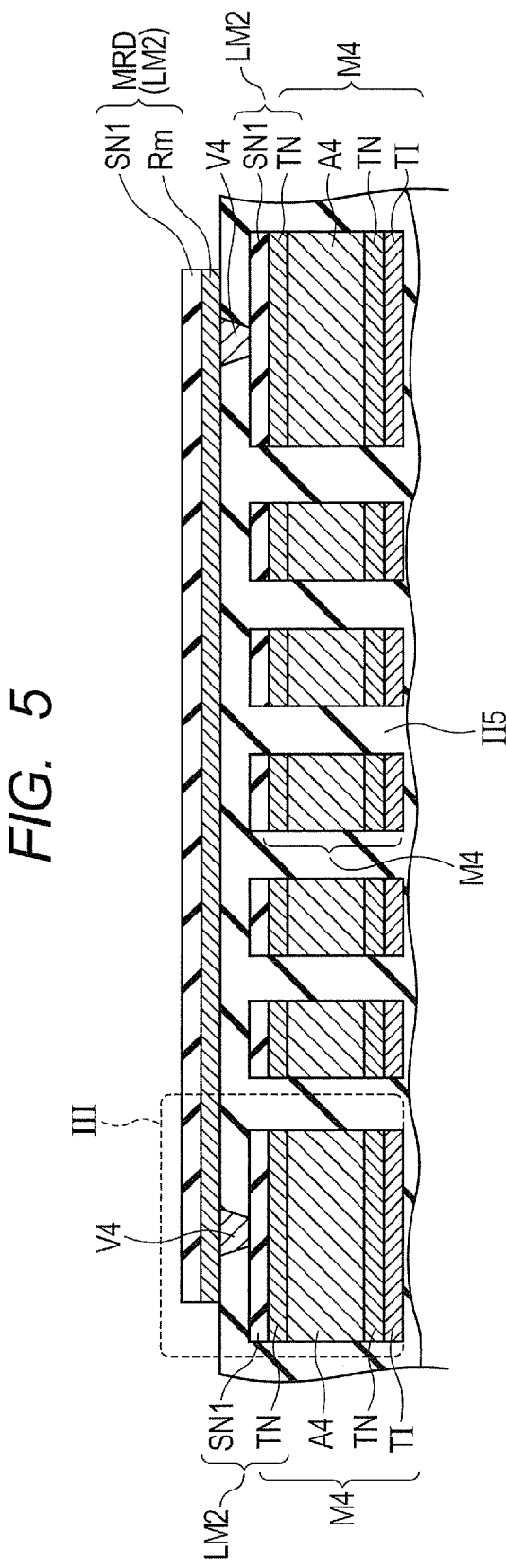
FIG. 5 is a schematic sectional view, taken along V-V Line in FIG. 4.

With reference to FIG. 5, a region III enclosed by a dotted line in FIG. 5 corresponds to a region V enclosed by a dotted line in FIG. 3. The laminated film LM2 covering the upper surface of the metal wiring A4 included in the wiring layer M4 has a configuration in which, for example, a TiN film TN and a silicon nitride film SN1 are laminated in this order. A layer, which is the same as the laminated film LM2, forms the metal resistive element MRD. Accordingly, the metal resistive element MRD also has a configuration in which, for example, the TiN film TN and the silicon nitride film SN1 are laminated in this order. The TiN film TN in the metal resistive element MRD, which is arranged as a metal resistive element layer Rm, is a conducting film that functions as a resistive element formed by TiN.

The silicon nitride film SN1 is an oxidation preventive film commonly referred to as a cap film, and electrically insulates the wiring layers M1 to M9 from the upper layers thereof. The laminated film LM1 covering the lower surface of the metal wiring A4 included in the wiring layer M4 has a configuration in which, for example, a titanium film TI and the TiN film TN are laminated in this order.

The titanium film TI and the TIN film TN that form the laminated films LM1 and LM2 function, integrally with the metal wirings A1 to A4, as conducting parts for wirings by being arranged so as to be in contact with the upper and lower surfaces of the wirings A1 to A4, etc. Accordingly, the conducting parts are collectively defined as the wiring layers M1 to M4, described later. In addition, the TiN film TN, which is a conducting film that forms the laminated films LM1 and LM2, is formed as a so-called barrier metal film having a function to suppress copper atoms, etc., included in the metal wirings A1 to A4 from being diffused toward the external titanium film TI, etc.

In the description of FIGS. 2 and 3, it has been described that the wiring layer MT is comprised of the uppermost metal wiring AT and the laminated films LM1 and LM2; however, it is considered that, because the titanium TI and the TiN film TN are actually conducting films but the silicon nitride film SN1 is an insulating film, the wiring layer MT is precisely comprised of: the laminated film LM1, which is a conducting film with respect to the uppermost wiring layer MT; the uppermost metal wiring AT; and the underlying TiN film TN of the laminated film LM2. Similarly, it is considered that the wiring layers M1 to M4 are also formed by the laminated films LM1, the metal wirings A1 to A4, and the underlying TIN films TN of the laminated films LM2, respectively. However, it is considered that the guard ring GR is a region where the laminated film LM1, the uppermost metal wiring AT, and the laminated film LM2 are entirely combined.

Accordingly, in the one embodiment, a TiN film as a metal resistive element layer Rm is arranged in the oscillator region OCR, the layer Rm being the same as the TiN film TN as a conducting film over uppermost metal wiring that forms the laminated film LM2 formed so as to cover the upper surface of the uppermost metal wiring AT of the wiring structure. By analyzing the film thickness and the composition (study of content of impurities, etc.) of each of the TiN film TN, covering the upper surface of the uppermost metal wiring AT in the wiring structure region MCR, and the metal resistive element layer Rm, it can be verified that the TiN film TN and the metal resistive element layer km are the same layer as each other. When the guard ring GR is arranged, it is particularly desirable to verify that the TiN film TN covering the upper surface of the uppermost metal wiring AT in the wiring structure region MCR and the TiN film TN that forms the laminated film LM2 in the guard ring GR are the same layer as each other and that the TiN film TN that forms the laminated film LM2 in the guard ring GR and the metal resistive element layer Rm are the same layer as each other.

In the above description, the TiN film TN, as the conducting film over the uppermost metal wiring AT, and the metal resistive element layer Rm (TiN film TN), which is arranged as the same layer as the TiN film TN, are independently arranged at positions spaced apart from each other.

Subsequently, a method of manufacturing a semiconductor device according to the one embodiment, which is illustrated, for example, in FIG. 2, will be described with reference to FIGS. 6 to 11. Herein, however, a method of manufacturing the uppermost wiring layer MT will be mainly described, and description of the layer located under the interlayer insulating film II5 in FIGS. 2 and 3 (located near to the semiconductor substrate SUB) will be omitted. Each of FIGS. 6 to 11 is a sectional view, taken along A-B Line in FIG. 1.

Figure 6:
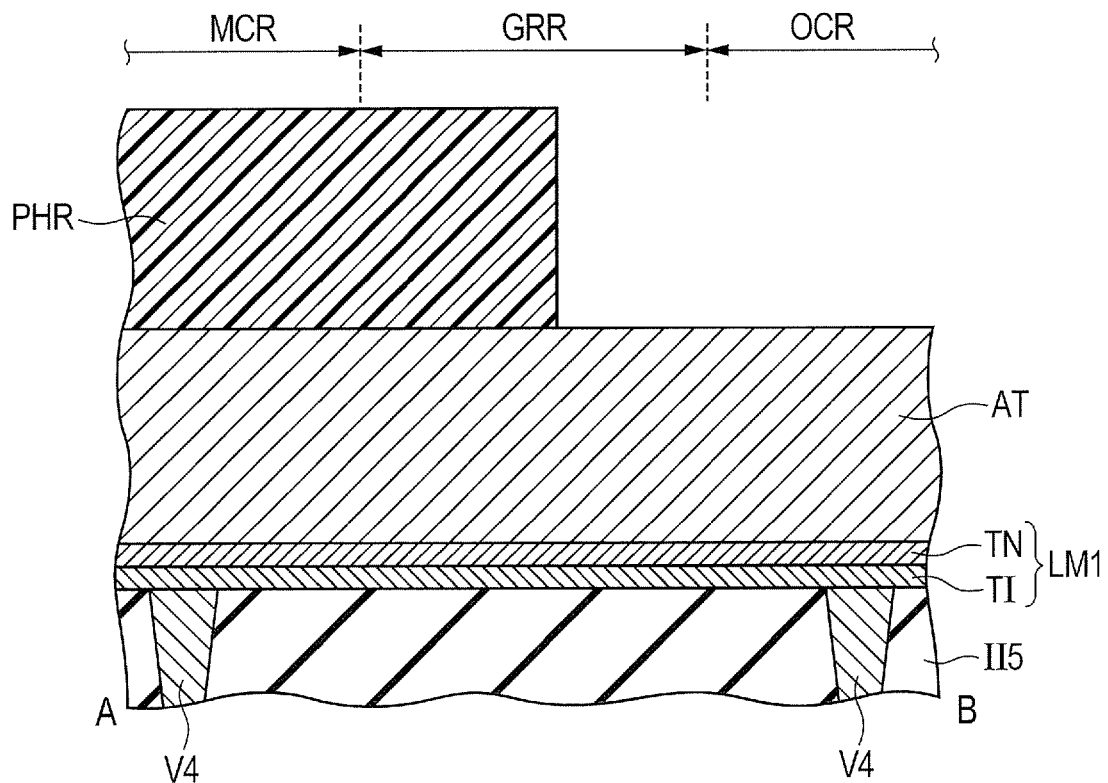
FIG. 6 is a schematic sectional view illustrating a first step of a method of manufacturing a semiconductor device in First Embodiment.

With reference to FIG. 6, the semiconductor substrate SUB having a main surface made, for example, of single crystalline silicon, which is not illustrated in FIG. 6 but illustrated, for example, in FIG. 2, is provided. The FMONOS type memory, the core transistor, and the I/O transistor are formed over the semiconductor substrate SUB by a generally and publicly known method, and the interlayer insulating films II1 to II5, the wiring layers M1 to M4, the vias V1 to V4, and the OCO circuit, etc., are formed. In FIG. 6, the interlayer insulating film 115 and the layers located above the film II5 are only illustrated, and illustration of the layers located thereunder is emitted.

After the upper surface of the interlayer insulating film II5 is polished so as to be flat by a chemical mechanical polishing method referred to as CMP, a via hole is formed in the interlayer insulating film II5 so as to reach the wiring layer M4 by a common photoengraving technique and etching technique. The inside of the via hole is filled with a conducting film made of tungsten by, for example, a PVD (Physical Vapor Deposition) method, and the via V4 is formed by polishing again the upper surface of the conducting film so as to be flat by CMP.

Subsequently, the laminated film LM1, in which the titanium film TI and the TiN film TN are formed in this order, is formed, for example, by a PVD method, and (a plurality of layers of) metal wirings, each of which is laminated one over another, are further formed over the laminated film LM1. The uppermost metal wiring A1, which is the uppermost layer of the metal wirings, is formed. As an example, the titanium film TI, the TiN film TN, and the uppermost metal wiring AT (comprised of aluminum-copper) are formed so as to have thicknesses of 10 nm, 20 nm, and 1 μm, respectively. The laminated film LM1 and the uppermost metal wiring AT are formed over almost the whole main surface of the semiconductor substrate SUB.

Subsequently, the pattern of a photoresist PHR is formed by performing a normal photoengraving technique such that the pattern of the uppermost metal wiring AT remains, of the main surface at the semiconductor substrate SUB, in a region to become the wiring structure region MCR (including part of a region to become the guard ring formation region GRR), i.e., a region where the uppermost metal wiring AT is to be formed.

Figure 7:
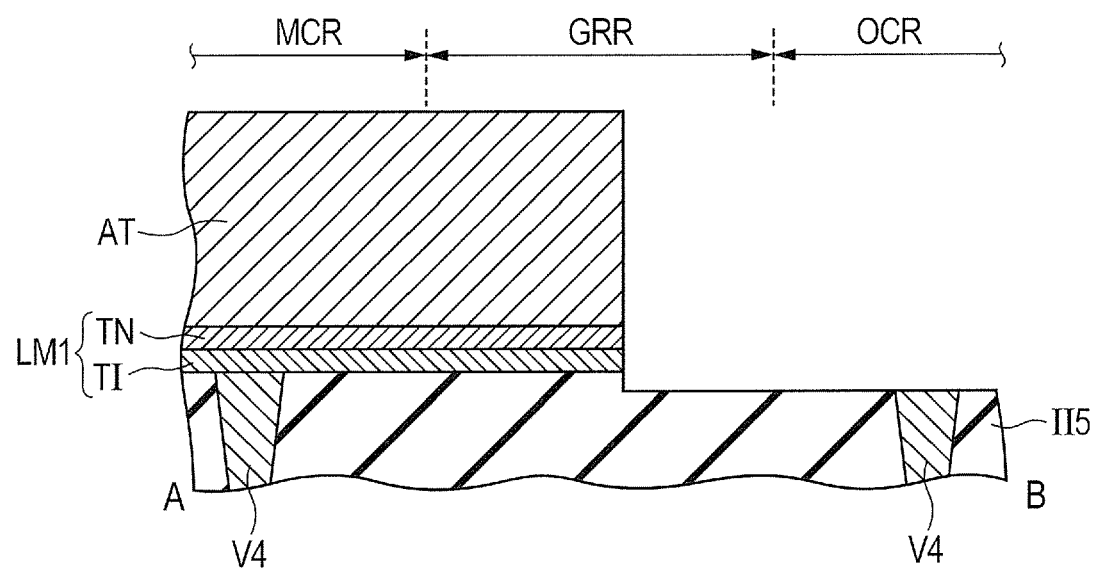
FIG. 7 is a schematic sectional view illustrating a second step of the method of manufacturing a semiconductor device in First Embodiment.

With reference to FIG. 7, the uppermost metal wiring AT is formed in the region to become the wiring structure region MCR by a normal etching technique using the pattern of the photoresist PHR formed in the step of FIG. 6. Herein, the region to become the wiring structure region MCR means, of the main surface of the semiconductor substrate SUB, a region to finally become the wiring structure region MCR by forming at least one layer of a metal wiring including the uppermost metal wiring AT. The pattern of the uppermost metal wiring AT is formed in both the region to become the wiring structure region MCR and part of the region to become the guard ring formation region GRR. The upper surface of the uppermost metal wiring AT is polished by CMP, if necessary.

Herein, all of the titanium film TI, the TiN film TN, and the uppermost metal wiring AT, which are present in both part of the region to (finally) become the guard ring formation region GRR and the region to (finally) become the oscillator region OCR, are removed by etching. This is performed in order to suppress a short circuit failure due to the aforementioned conducting films TI, TN, and AT from occurring. It is desirable that part of the interlayer insulating film II5 in the regions GRR and OCR is etched (over-etched) in order to suppress a short circuit failure, etc., due to toe remaining of a conducting film by surely removing the conducting films TI, TN, and AT in both part of the region to become the guard ring formation region GRR and the region to become the oscillator region OCR. Hereinafter, the aforementioned expression: "to become the region" will be omitted.

Figure 8:
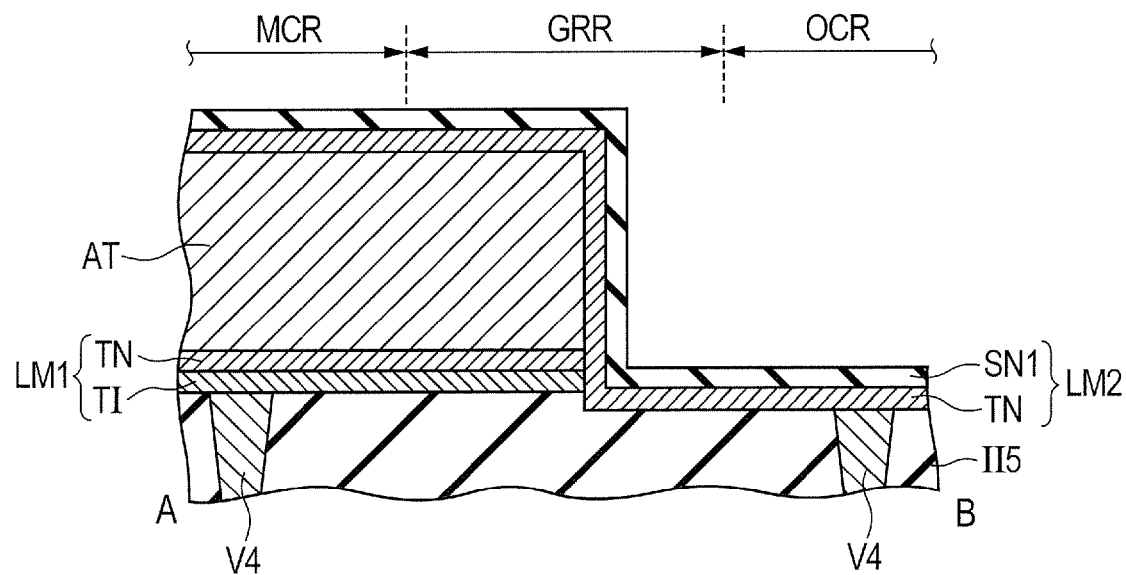
FIG. 8 is a schematic sectional view illustrating a third step of the method of manufacturing a semiconductor device in First Embodiment.

With reference to FIG. 8, the laminated film LM2 is formed, in which the TiN film TN, as a conducting film extending, in the oscillator region OCR (located side by side with the wiring structure region MCR over the main surface of the semiconductor substrate SUB), from the upper surface of the uppermost metal wiring AT to the interlayer insulating film II5 (arranged in contact with the lower surface of the uppermost metal wiring AT), and the silicon nitride film SN1 are laminated in this order. Specifically, after the TiN film TN having a thickness of 33 nm as an example is formed, for example, by a PVD method, the silicon nitride film SN1 having a thickness 50 nm as an example is formed, for example, by a CVD (Chemical Vapor Deposition) method.

Herein, the pattern of the uppermost metal wiring AT is formed in the wiring structure region MCR and part of the guard ring formation region GRR; however, the uppermost metal wiring AT is not formed in part of the guard ring formation region GRR oscillator region OCR. Accordingly, the laminated film LM2 is formed so as to cover the upper surface and the side surface of the uppermost metal wiring AT and to cover the uppermost surface of the oscillator region where the uppermost metal wiring AT is not formed (including part of the guard ring formation region GRR), i.e., the upper surface of the interlayer insulating film II5. Accordingly, it is desirable that the laminated film LM2 is bent so as to have a stepped sectional shape it which the laminated film LM2 extends from the upper surface of the uppermost metal wiring AT to the side surface thereof and farther extends to the upper surface of the interlayer insulating film II5. It can be said from the above description that the laminated film LM2 covering the upper surface of the interlayer insulating film II5 is formed under the laminated film LM2 covering the upper surface the uppermost metal wiring AT.

Figure 9:
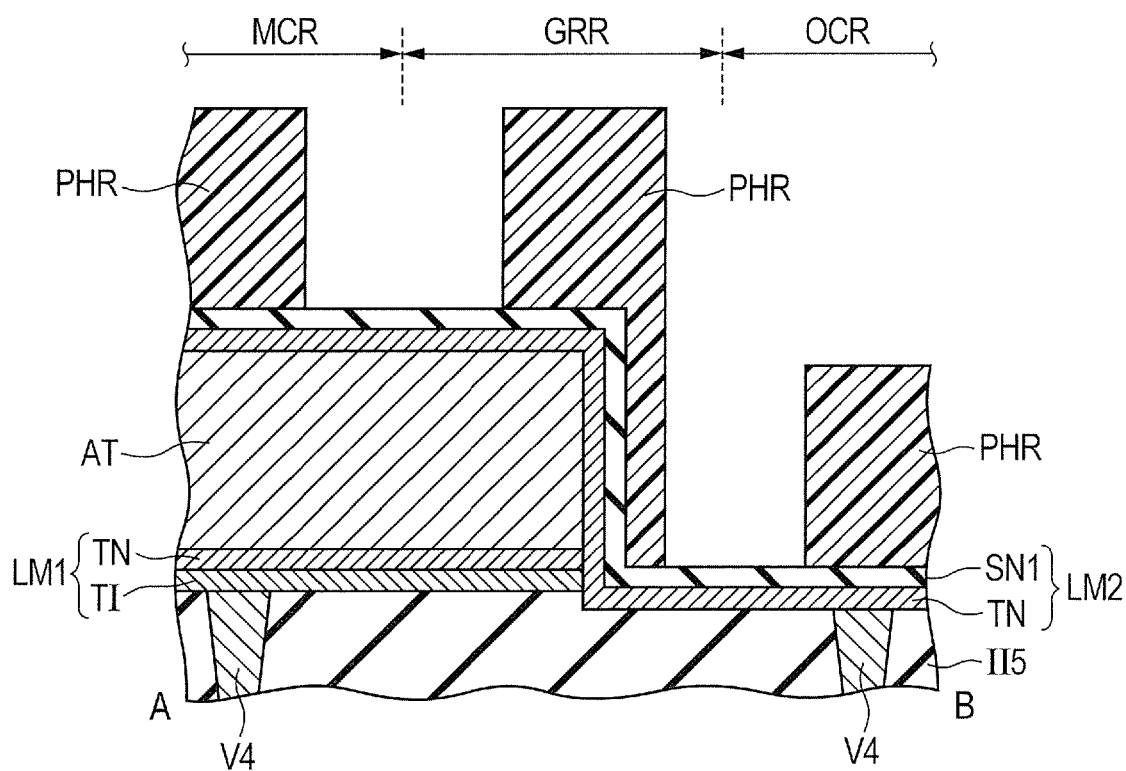
FIG. 9 is a schematic sectional view illustrating a fourth step of the method of manufacturing a semiconductor device in First Embodiment.

With reference to FIG. 9, the pattern of the photoresist PHR is formed by performing a normal photoengraving technique such that the pattern of the laminated film LM2 remains, of the main surface of the laminated film LM2, in: a region where the wiring layer MT is formed in the wiring structure region MCR; a region where the guard ring CR is formed in the guard ring formation region GRR; and a region where the metal resistive element MRD is formed in the oscillator region OCR.

Figure 10:
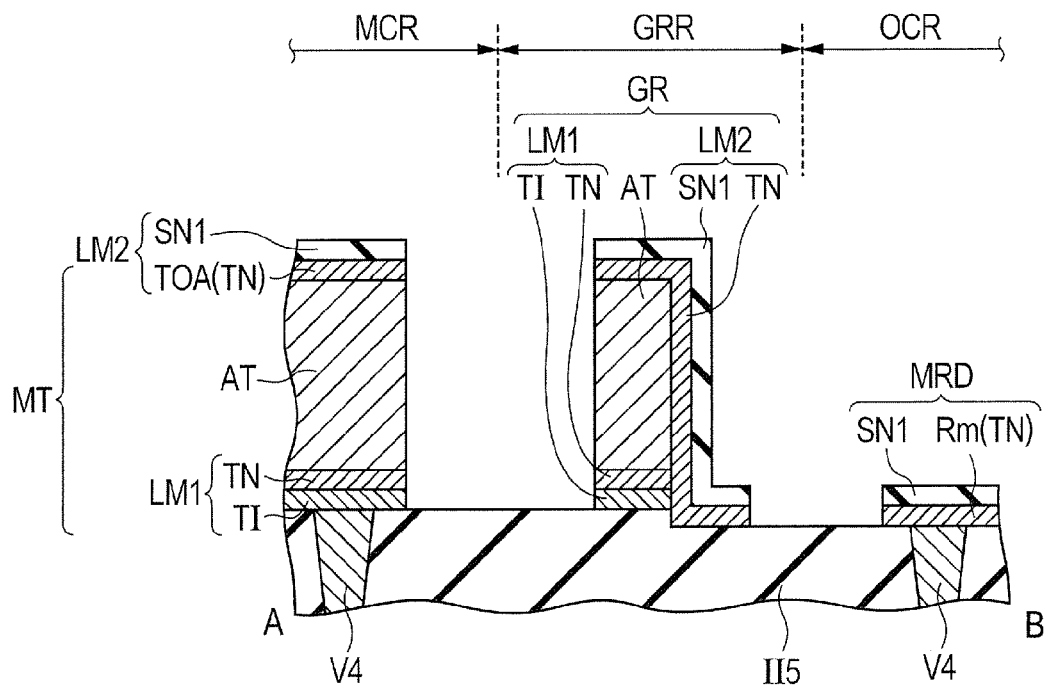
FIG. 10 is a schematic sectional view illustrating a fifth step of the method of manufacturing a semiconductor device in First Embodiment.

With reference to FIG. 10, the laminated film LM2 is patterned by a normal etching technique using the pattern of the photoresist PHR formed in the step of FIG. 9, thereby allowing a pattern (laminated film LM2) in which the conducting film TN and the silicon nitride film SN1 are laminated to be formed. This laminated pattern is formed: of the wiring structure region MCR, in the region where the wiring layer M1 is formed; of the guard ring format region GRR, in the region where the guard ring GR is termed; and of the oscillator region OCR, in the region where the metal resistive element MRD is formed.

The pattern in which the laminated film LM2 is laminated is formed just above the uppermost metal wiring AT in the wiring structure region MCR, and is also formed over the upper surface and the side surface of the uppermost metal wiring AT of the guard ring GR in the guard ring formation region GRR. Further, the pattern in which the laminated film LM2 is laminated is also formed over part of the upper surface of the interlayer insulating film II5 in the oscillator region OCR. The laminated films LM2 in these three regions have an aspect in which they are independently arranged at positions separated from each other, but are formed as the same layer as each other.

In the wiring structure region MCR, the TiN film TN is formed as the conducting film over uppermost metal wiring TOA covering the upper surface of the uppermost metal wiring AT, and the uppermost wiring layer MT, which is a conducting film, is formed by the laminated film LM1, the uppermost metal wiring AT, and the conducting film over uppermost metal wiring TOA (TiN film TN). The silicon nitride film SN1, which is an insulating film, is formed, as an oxidation preventive film (cap film), so as to cover the upper surface of the wiring layer MT. In the wiring structure region MCR, the laminated film LM2, which is comprised of both the conducting film over uppermost metal wiring TOA and the silicon nitride film SN1 that is present thereover and is comprised of an oxidation preventive film, is formed so as to cover the upper surface of the metal wiring AT.

In the guard ring formation region GRR, the TiN film TN as the conducting film over uppermost metal wiring TOA is formed so as to integrally extend from the upper surface to the side surface of a structure in which the laminated film LM1 and the uppermost metal wiring AT are laminated, and further extend to the over-etched upper surface of the interlayer insulating film II5. The silicon nitride film SN1 is formed, as an oxidation preventive film (cap film), so as to cover the upper surface of the TiN film TN. The laminated film LM2 is formed by the TIN film TN and the silicon nitride film SN1. Thus, the guard ring GR comprised of the laminated film LM1, the uppermost metal wiring AT, and the laminated film LM2 is formed.

Because the uppermost metal wiring AT is not present in the oscillator region OCR, the metal resistive element layer Rm (TiN film TN) is formed, in part of the upper surface of the interlayer insulating film II5, as the same layer as the conducting film over uppermost metal wiring TOA, and the silicon nitride film SN1 is formed so as to cover the upper surface of the metal resistive element layer Rm. The laminated film LM2 is formed as the metal resistive element MRD by the metal resistive element layer Rm (TiN film TN) and the silicon nitride film SN1.

It is desirable that the wiring layer MT in the wiring structure region MCR and the metal resistive element MRD in the oscillator region OCR are formed just avove the via V4 formed in the interlayer insulating film II5 and that they are electrically coupled to the layers under the via V4 via the via V4.

An aspect in which the wiring layer MT, the guard ring GR, and the metal resistive element MRD, which are illustrated in FIG. 10, are formed so as to be separated from each other corresponds to a region X enclosed by a dotted line in FIG. 3.

Subsequently, a so-called HDP silicon dioxide film PSON, the silicon nitride film SN, and the passivation film PIX, which are illustrated, for example, in FIG. 2, are formed in this order by a generally and publicly known method. The passivation film PIX is a thin film for protecting the whole semiconductor device from above and is formed, for example, by a silicon nitride film. With the aforementioned configuration, a semiconductor device according to one embodiment is formed, in which, for example, a microcontroller product is mounted.

Figure 11:
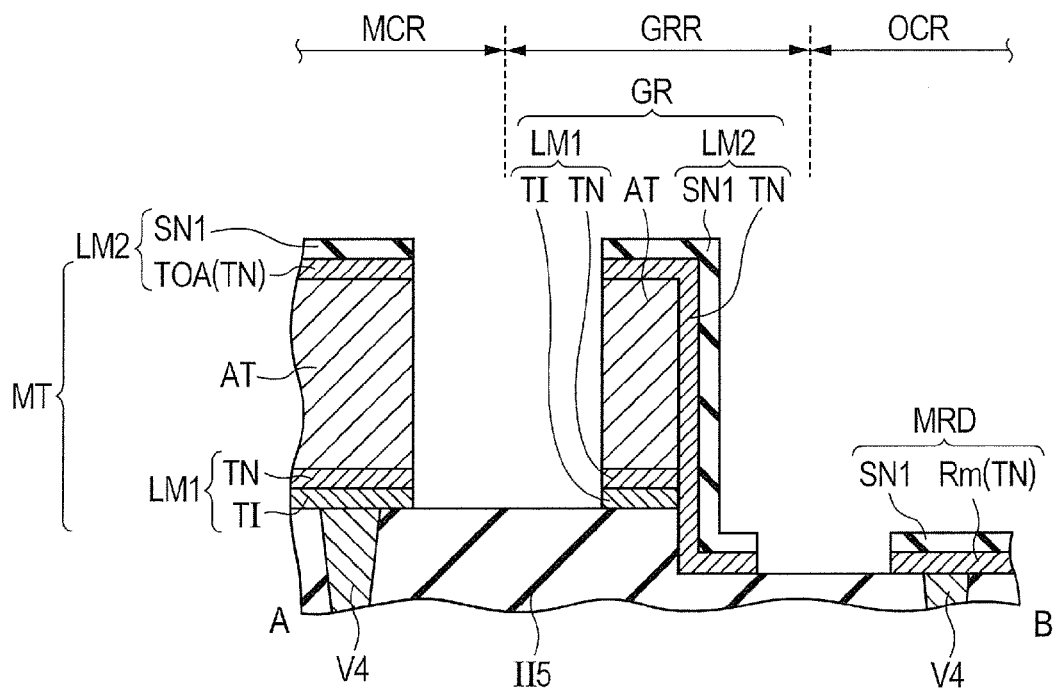
FIG. 11 is a schematic sectional view illustrating a variation of FIG. 10.

With reference to FIG. 11, this configuration is basically the some as that in FIG. 10; however, a depth, at which the interlayer insulating film II5 is over etched in the regions GRR and OCR during the step (illustrated in FIG. 7) in which the uppermost metal wiring AT is patterned, becomes larger than that in FIG. 10. An etching amount of the interlayer insulating film II5 is arbitrary, but it is desirable that the pattern of the TiN film TN, which is formed in at least the oscillator region OCR as the metal resistive element layer Rm, is formed at a position lower than that of the TiN film TN (at a position nearer to the semiconductor substrate SUB), the TiN film TN being termed as part of the laminated film LM2 that forms the uppermost wiring layer MT in the wiring structure region MCR. In FIGS. 10 and 11, however, the metal resistive element layer Rm is formed, for example, under the laminated film LM1 that forms the wiring layer MT.

Subsequently, operations and effects of the one embodiment will be described with reference to a comparative example of FIGS. 12 to 20.

Figure 12:
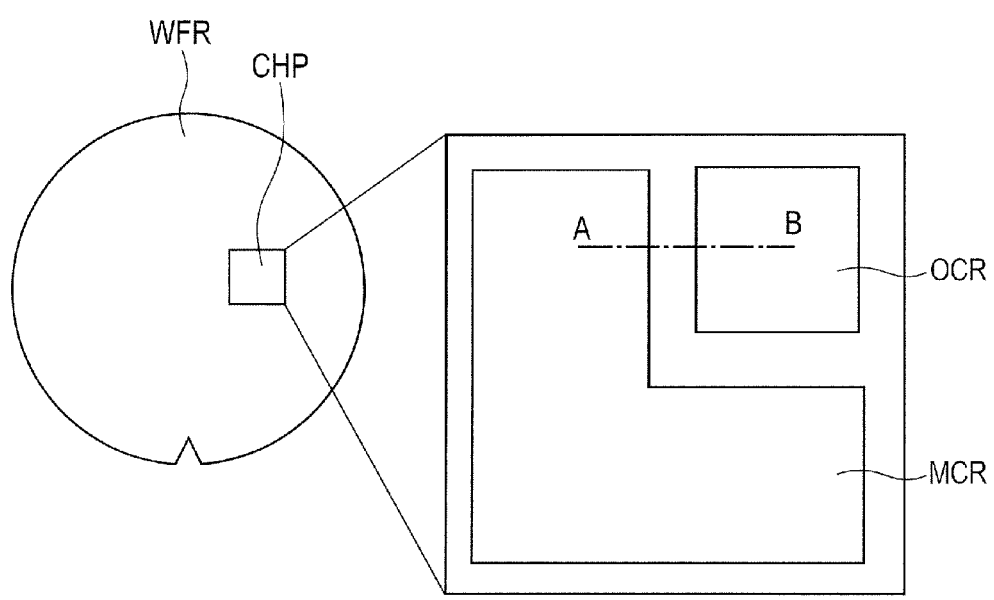
FIG. 12 is a schematic view for explaining a semiconductor chip of a comparative example.

With reference to FIG. 12, similarly to the semiconductor device according to the one embodiment, a semiconductor device of the comparative example is also formed as the semiconductor chip CHP cut off as part of the semiconductor wafer WFR. However, FIG. 12 is different from FIG. 1 in that the wiring structure region MCR and the oscillator region OCR are only formed over the main surface of the semiconductor chip CHP of the comparative example and the guard ring formation region GRR (guard ring GR) is not formed.

Figure 13:
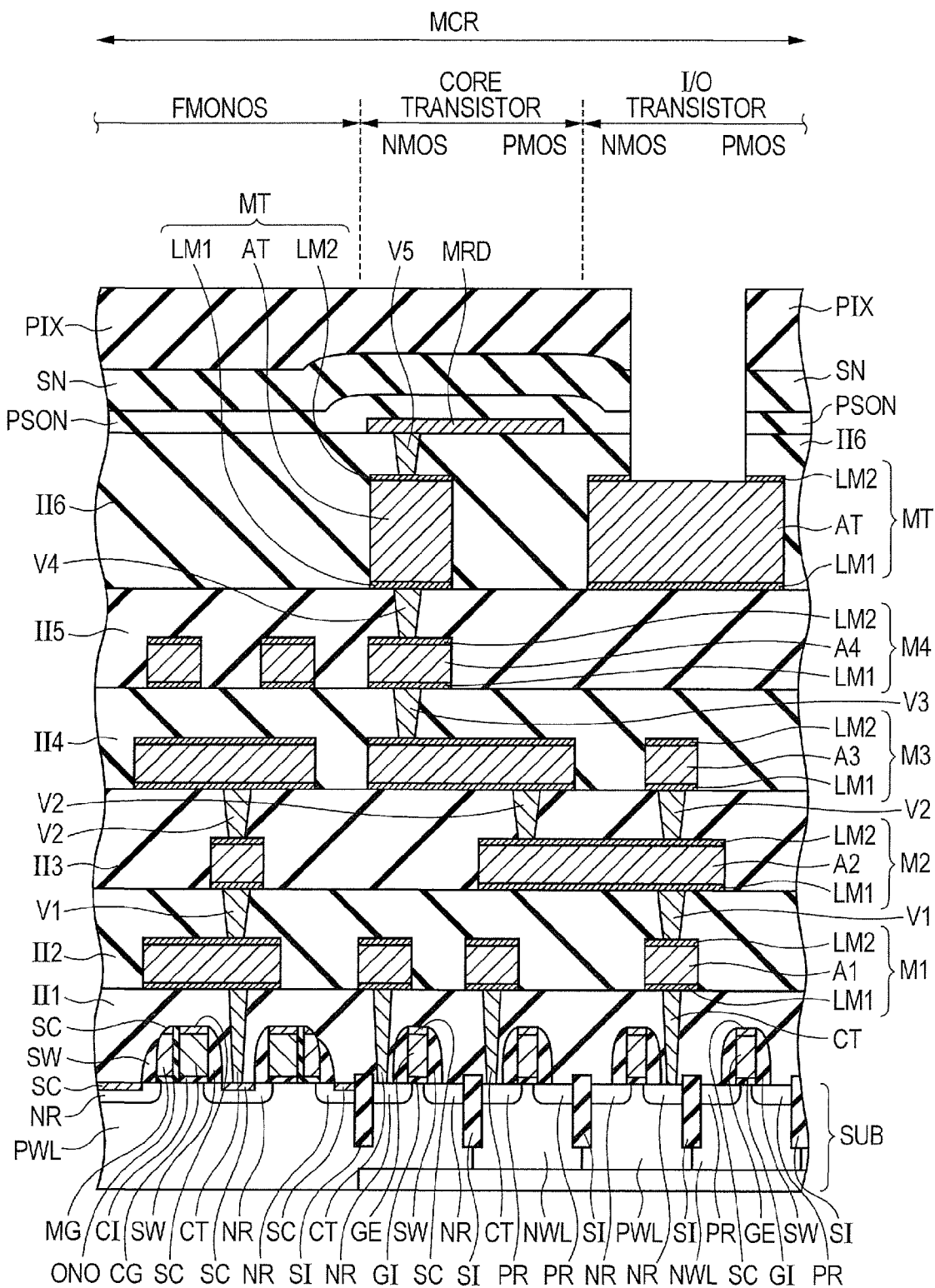
FIG. 13 is a schematic sectional view illustrating a configuration of an integrated circuit and a multi-layer wiring structure that form a microcontroller product of the comparative example.

With reference to FIG. 13, a configuration of an integrated circuit and a multi-layer wiring structure that form a microcontroller product is basically the same as that of the semi conductor device according to the one embodiment illustrated in FIG. 2; however, the configuration herein is different from that in FIG. 2 in that the metal resistive element MRD is not formed as the same layer as the laminated film LM2 formed so as to cover the upper surface of the uppermost wiring layer MT. Specifically, the metal resistive element MRD is arranged (in a region where, for example, the core transistor in the wiring structure region MCR is formed), above the uppermost wiring layer MT (over the upper surface of the interlayer insulating film II6), so as be independent of the laminated film LM2 of the uppermost metal wiring AT, so that the metal resistive element MRD and the wiring layer MT are electrically coupled to each other via the via V5.

Subsequently, with reference to FIGS. 14 to 20, a method of manufacturing a semiconductor device of the comparative example illustrated, for example, in FIG. 13 will be described. Also herein, a method of manufacturing the uppermost wiring layer MT will be mainly described, similarly in the manufacturing method according to the one embodiment.

Figure 14:
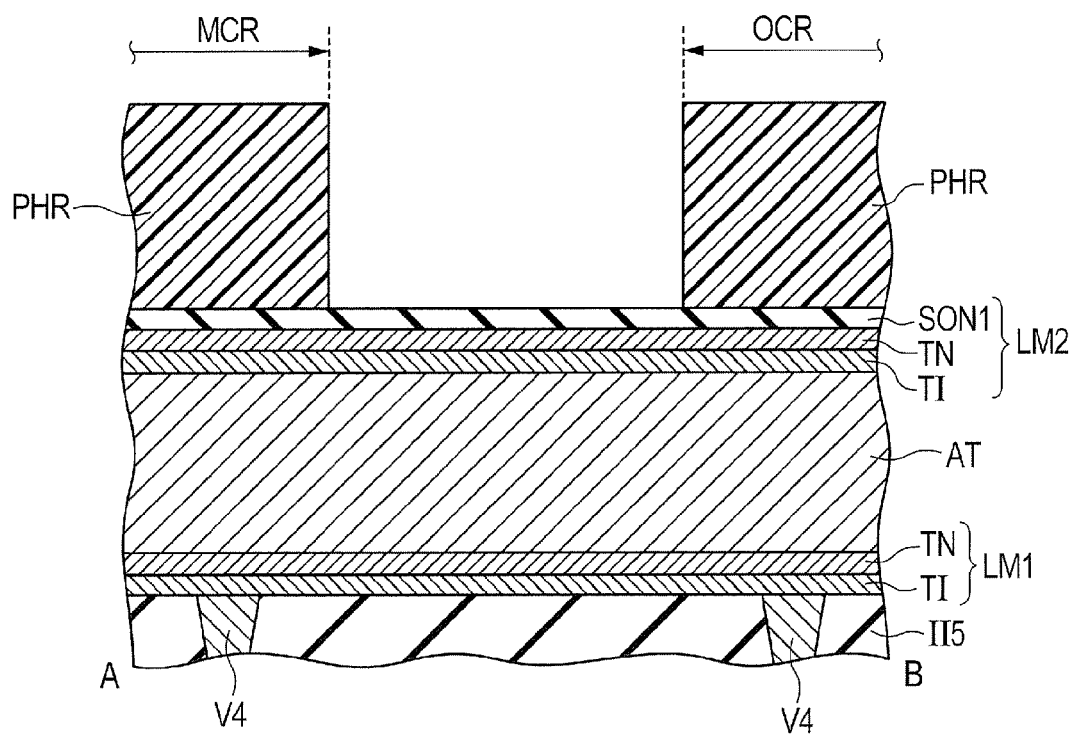
FIG. 14 is a schematic sectional view illustrating a a method of manufacturing a semiconductor device comparative example.

With reference to FIG. 14, the interlayer insulating film IT5, the via V4, the laminated film LM1, and the uppermost metal wiring AT are formed, similarly in FIG. 6. Herein, the laminated film LM1 and the uppermost metal wiring AT are formed over almost the whole main surface of the semiconductor substrate SUB Subsequently, the laminated film LM2, in which the titanium film TI, the TiN film TN, and a silicon oxynitride film SON1 formed by a CVD method are laminated in this order, is formed over elm the whole upper surface of the uppermost metal wiring AT. Herein, the laminated film LM2 is slightly different from that according to the one embodiment in that this laminated film LM2 includes the titanium film TI and the silicon oxynitride film SON1.

Subsequently, the pattern of the photoresist PHR is formed by performing a normal photoengraving technique such that the pattern of the uppermost metal wiring A1 remains, of the main surface of the semiconductor substrate SUB, in the wiring structure region MCR and the oscillator region OCR.

Figure 15:
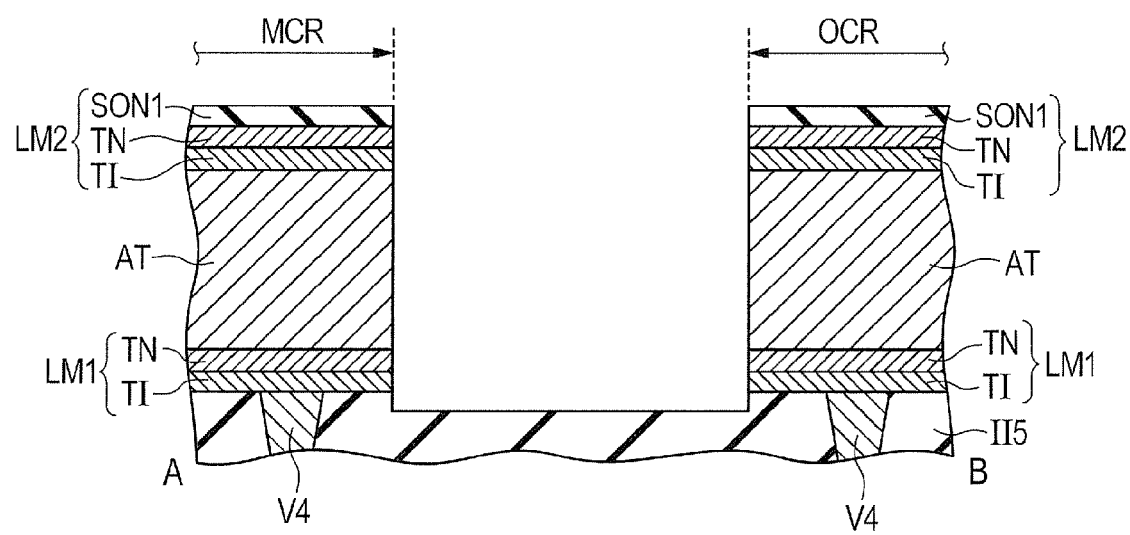
FIG. 15 is a schematic sectional view illustrating a second step of the method of manufacturing a semiconductor device in the comparative example.

With reference to FIG. 15, a structure, in which the laminated film LM1, the uppermost metal wiring AT, and the laminated film LM2 are laminated, is formed in the wiring structure region MCR and the oscillator region OCR by a normal etching technique using the pattern of the photoresist PER formed in the step of FIG. 14. On the other hand, the aforementioned laminated film LM1, the uppermost metal wiring AT, and the laminated film LM2 are removed by etching in a region sandwiched by the wiring structure region MCR and the oscillator region OCR, and further part of the interlayer insulating film II5 is removed by over-etching.

Thus, the uppermost wiring layer MT comprised of the laminated film LM1, the uppermost metal wiring AT, and the titanium film TI and the TiN film TN of the laminate film LM2 is formed in the wiring structure: region MCR. The u surface of the wiring layer MT is covered with the silicon oxynitride film SON1 as an insulating film (cap film).

Figure 16:
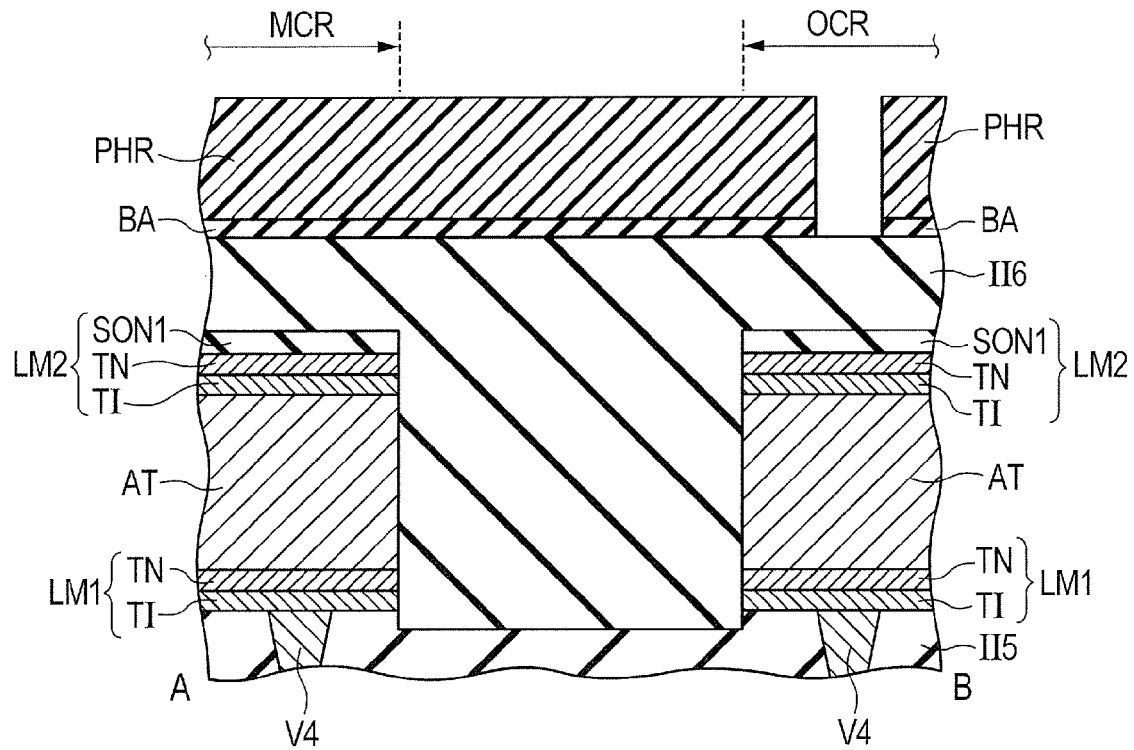
FIG. 16 is a schematic sectional view illustrating a third step of the method of manufacturing a semiconductor device in the comparative example.

With reference to FIG. 16, both the interlayer insulating film II6 comprised, for example, of a silicon oxide film and a downward anti-reflection film BA covering interlayer insulating film II6 are formed by a generally and publicly known method so as to cover the silicon oxynitride film SON1 and the exposed interlayer insulating film II5. The downward anti-reflection film BA is an anti-reflection film to be formed to reduce a failure in which, when the photoresist PHR is exposed, an unintended region is irradiated because an influence of reflection (standing wave effect) of the light used in a normal photoengraving technique, in particular, used in an exposure treatment becomes large, the reflection of the light being caused by aluminum and tungsten silicon (WSi), etc. The downward anti-reflection film is normally formed just under the photoresist PHR. This downward anti-reflection film BA is formed, for example, by silicon oxynitride (SiON).

The photoresist PER and the downward anti-reflection film BA are patterned by a normal photoengraving technique and an etching technique.

Figure 17:
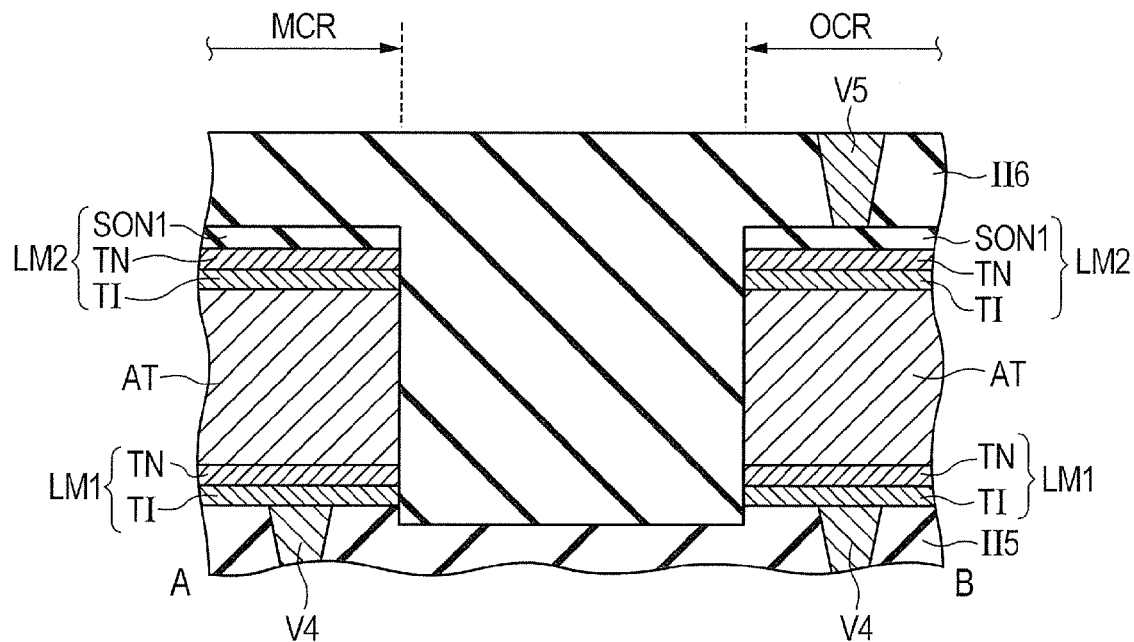
FIG. 17 is a schematic sectional view illustrating a fourth step of the method of manufacturing a semiconductor device in the comparative example.
Figure 18:
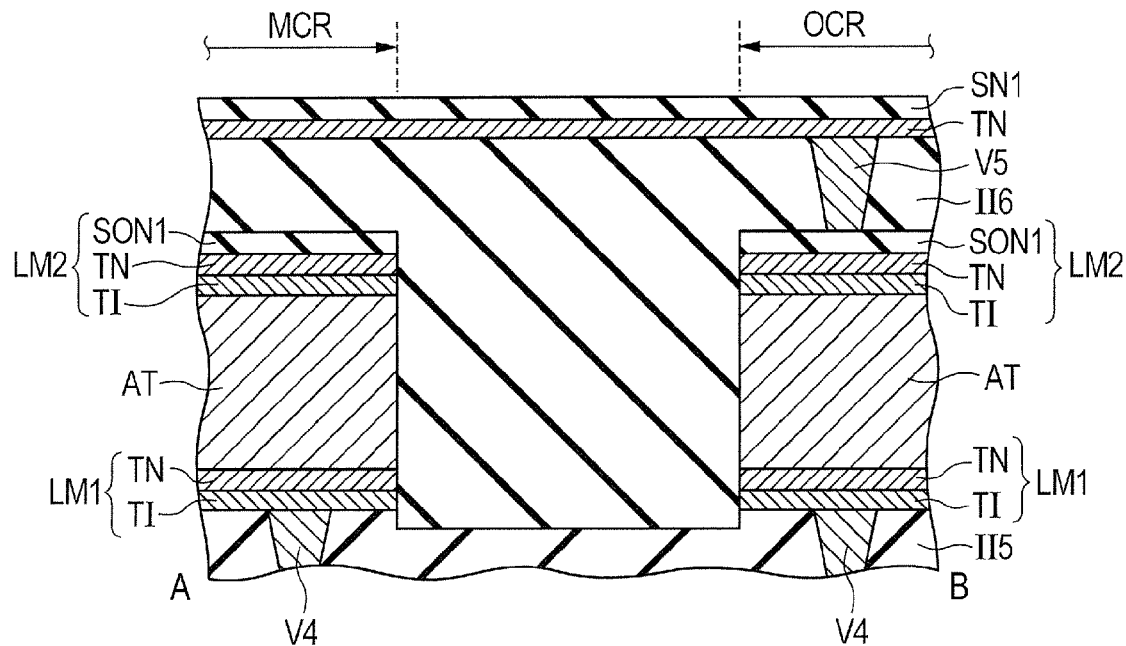
FIG. 18 is a schematic sectional view illustrating a fifth step of the method of manufacturing a semiconductor device in the comparative example.

With reference to FIG. 17, a via hole is formed in the interlayer insulating film II6 in the oscillator region OCR so as to be in contact with the upper surface of the silicon oxynitride film SON1 by a normal etching technique using the pattern of the photoresist PHR (and the downward anti reflection film BA) formed in the step of FIG. 16. The via V5 is formed with the via hole being filled with tungsten.

With reference to FIG. 10, the TiN film TN and the silicon nitride film SN1 are laminated in this order so as to cover the upper surface of each of the interlayer insulating film II6 and the via V5.

Figure 19:
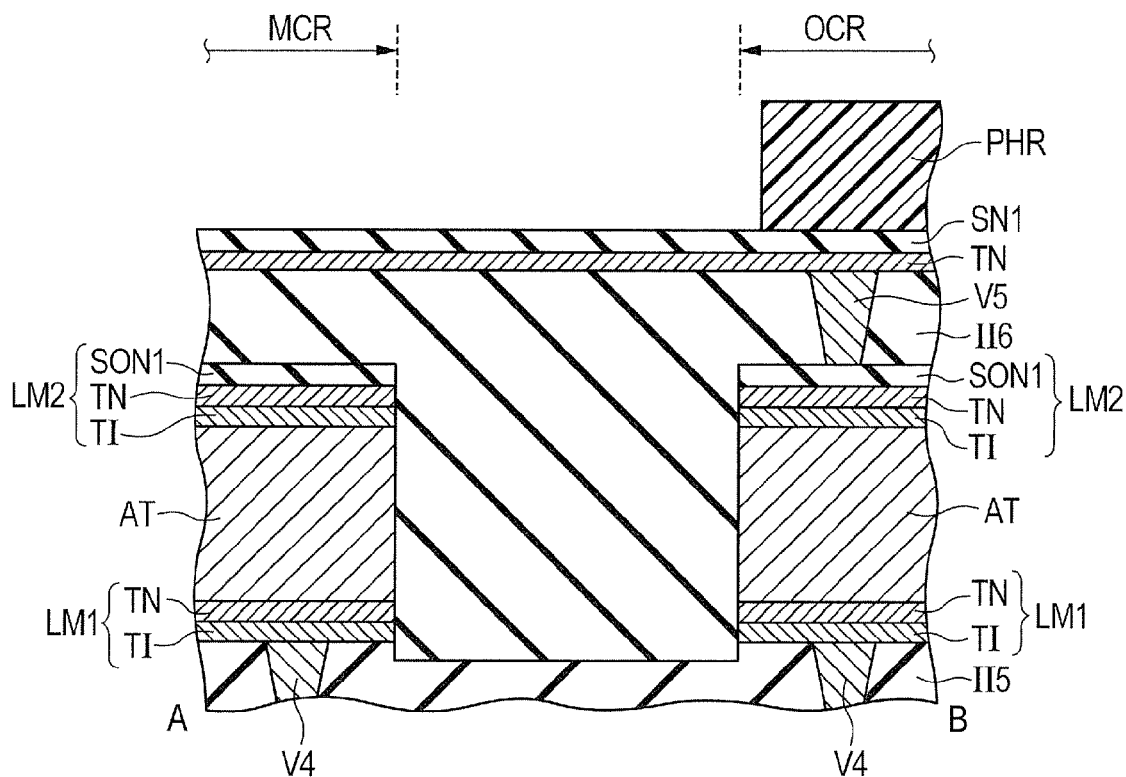
FIG. 19 is a schematic sectional view illustrating a sixth step of the method of manufacturing a semi conductor device in the comparative example.

With reference to FIG. 19, the pattern of the photoresist PHR is formed by performing a normal photoengraving technique such that the pattern of the uppermost metal wiring AT remains in the oscillator region OCR (just above the uppermost metal wiring AT in the oscillator region OCR).

Figure 20:
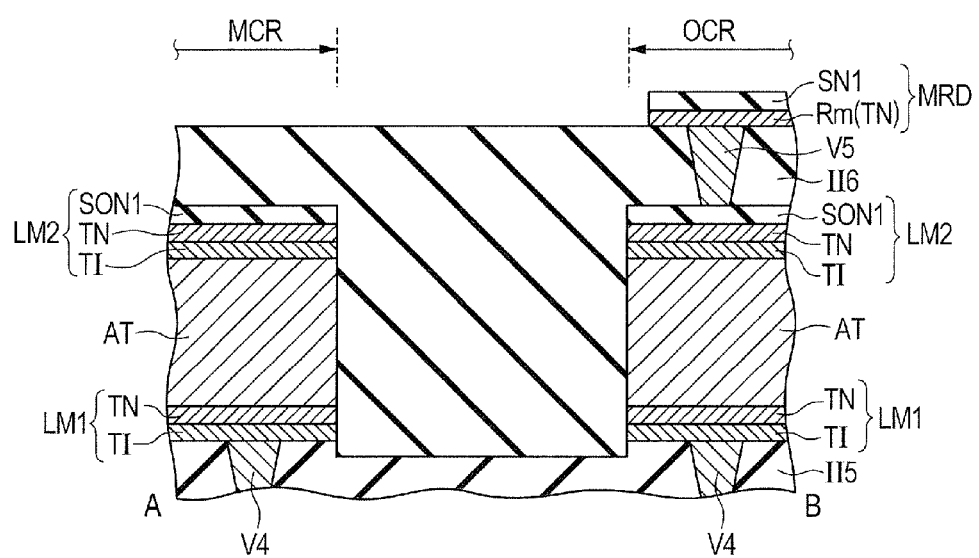
FIG. 20 is a schematic sectional view illustrating a seventh step of the method of manufacturer a semiconductor device in the comparative example.

With reference to FIG. 20, the TiN film TN and the silicon nitride film SN1, which are located over the interlayer insulating film II5, are patterned by a normal etching technique using the pattern of the photoresist PHR formed in the step of FIG. 19. Thereby, the metal resistive element MRD comprised of a laminated structure formed by the TiN film TN and the silicon nitride film SN1 is formed just above the uppermost metal wiring AT and the laminated film LM2 in the oscillator region OCR and via the via V5. The TiN film TN that forms the metal resistive element MRD functions as the metal resistive element layer Rm.

Thus, in the comparative example, after the TiN film TN that forms the uppermost wiring layer MT is formed, the TiN film TN as the metal resistive element layer Rm is afresh formed above the uppermost wiring layer MT and as a layer different from the former TiN film TN. Accordingly, the number of steps becomes very large in the comparative example, thereby possibly causing an increase cost.

In the one embodiment, the metal resistive element layer Rm, as the same layer as the TiN film TN that is formed as the conducting film over uppermost metal wiring TOA that to forms the wiring layer MT, is formed simultaneously with the TiN film TN. Accordingly, the number of steps is reduced to a value smaller than that in the comparative example, thereby allowing manufacturing cost to be reduced.

Also, from the viewpoint that it is not needed in the one embodiment to term the downward anti-reflection film BA in FIG. 16 of the comparative example, the number of steps can be made smaller in the one embodiment. However, the downward anti reflection film BA may also be formed so as to cover the lower surface of the photoresist PHR in the one embodiment, similarly in FIG. 16 of the comparative example.

The metal resistive element layer Rm according to the one embodiment is arranged as the same layer as the TiN film TN as the conducting film over uppermost metal wiring TOA covering the upper surface of the uppermost metal wiring AT. Accordingly, the flexibility in designing the thickness of the metal resistive element layer Rm can be further enhanced, in comparison with the case where the metal resistive element layer Rm is formed, for example, as the same layer as the TiN film TN covering the lower surface of the uppermost metal wiring AT. The this that: it is needed to design the thickness of the film TN covering, for example, the lower surface of the uppermost metal wiring AT, taking into consideration the possibility of being damaged, example, in the subsequent stops; while it is not needed to take into consideration such possibility in designing the thickness of the TiN film TN covering the upper surface.

The TiN film TN covering, for example, the lower surface of the uppermost metal wiring AT can be damaged simultaneously when the uppermost metal wiring AT, located above, or the like is patterned, in the first place. If a layer, which is the same as a layer that can be damaged by an influence occurring when the above layer is patterned, is used as the metal resistive element layer Rm in the oscillator region OCR that is another element region, there is the possibility that the metal resistive element layer Rm may also be influenced by the above damage. By using a layer, which is the same as the conducting film over uppermost metal wiring TOA covering the upper surface of the uppermost metal wiring AT, as the metal resistive element layer Rm, the possibility of being influenced by the above damage can be reduced.

The metal resistive element layer Rm according to the one embodiment is arranged at a position lower than that of at least the conducting film over uppermost metal wiring TOA (TN). With such a configuration, the thickness of the passivation film PIX covering the upper surface of the metal resistive element layer Rm becomes larger than that of at least the passivation film PIX covering the upper surface of the conducting film over uppermost metal wiring TOA, and hence the effect of surely protecting the metal resistive element layer Rm from above can be enhanced. That is, a failure, in which the metal resistive element layer Rm is damaged by entry of water from the outside, etc., or the like, can be surely suppressed.

Alternatively, the metal resistive element layer Rm is arranged at a position lower than that of the laminated film LM1 of the uppermost wiring layer MT in the one embodiment (see FIGS. 3 and 10). With such a configuration, the thickness of the passivation film PIX covering the above of the metal resistive element layer Rm becomes further large, and hence the above protective effect by the passivation film PIX can be further enhanced.

Subsequently, the guard ring formation region GRR is provided between the wiring structure region MCR and the oscillator region OCR in the one embodiment, and the guard ring GR is arranged in the region GRR. This guard ring GR is independently formed so as to be separated from both the wiring layer MT in the wiring structure region MCR and the metal resistive element MRD in the oscillator region OCR. Accordingly, occurrence of a short circuit failure, etc., which is caused with the remains of a pattern going back and forth between the wiring structure region MCR and the oscillator region OCR when an etching technique is performed in the process, can be suppressed.

Because the wiring layer MT and the metal resistive element MRD in the wiring structure region MCR are independently arranged at positions spaced apart from each ether, the possibility that both may be electrically influenced each other is reduced. Accordingly, a precision error, such as a variation in the resistance values of the metal resistive element layer Rm resulting from the aforementioned influence, can be reduced, thereby allowing the reliability of the OCO circuit in the oscillator region OCR to be further enhanced.

Further, with the guard ring GR being present, the inside of the guard ring GR (oscillator region OCR) is hardly influenced by an influence of a variation in stress from the outside, even if the layout pattern of a circuit formed in the wiring structure region MCR outside the region enclosed by the guard ring GR (oscillator region OCR). That is, the conditions of the stress applied to the metal resistive element MRD in the oscillator region OCR become almost the same, irrespective of, for example, the degree of the roughness and fineness of the pattern of the wiring in the wiring structure region MCR.

When the stress applied to the metal resistive element MRD in the oscillator region OCR is changed in accordance with the state or roughness and fineness, etc., of the layout of the wiring structure region MCR, the resistance value of the metal resistive element MRD varies, and accordingly the oscillation characteristic of the OCO circuit changes. Thereby, there is the possibility that the reliability of the OCO circuit may be deceased. However, the guard ring GR has a function suppressing the aforementioned variations in the resistance values and oscillation characteristic, hence stable oscillation characteristic of the OCO circuit can be secured.

Further, by using the TiN film TN as the metal resistive element layer Rm in one embodiment, occurrence of a so-called ffect can be suppressed, and hence a variation in the resistance values, result g m the stress due to the piezo-resistance effect, becomes small, thereby allowing stable oscillation characteristic of the OCO circuit to be secured.

Second Embodiment

Figure 21:
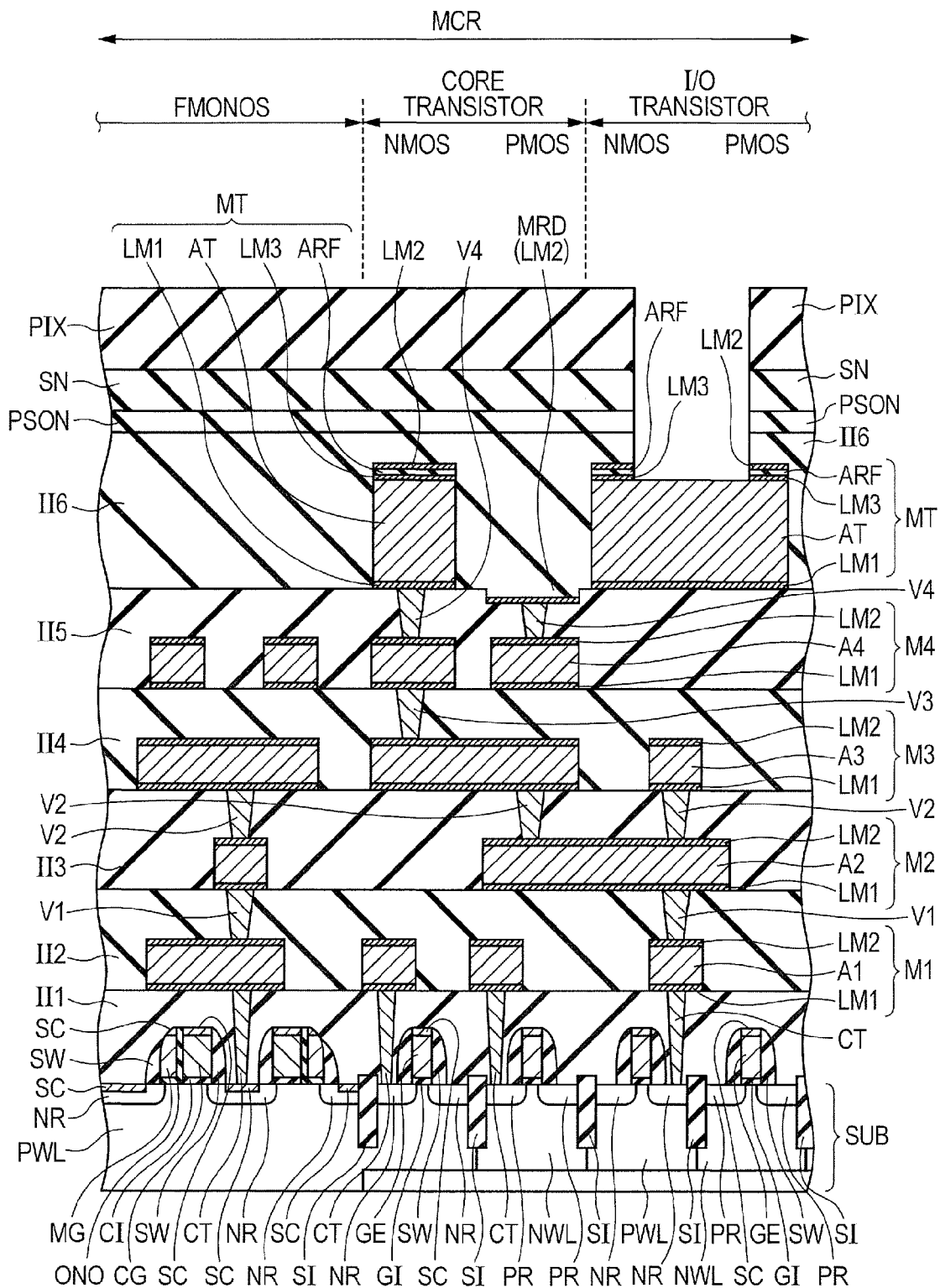
FIG. 21 is a schematic sectional view illustrating a configuration of an integrated circuit and a multi-layer wiring structure that form a microcontroller product according to Second Embodiment.

With reference to FIG. 21, the present embodiment is different from First Embodiment in that the present embodiment further has an anti-reflection insulating film ARF that is formed so as to be sandwiched between the uppermost metal wiring AT that forms the uppermost wiring layer MT and (part of) the laminated film LM2 formed as the same layer as part of the metal resistive element MRD (metal resistive element layer). This anti-reflection insulating film ARF has a function of suppressing diffused reflection of light occurring when an exposure treatment is performed, similarly to the aforementioned downward anti-reflection film BA.

In more detail, a laminated film LM3 and the anti-reflection insulating film ARF are laminated in this order between the uppermost metal wiring AT and the laminated film LM2.

As described later, the laminated film LM3 has a configuration in which, for example, the titanium film TI and the TiN film TN are laminated in this order, similarly to the laminated film LM1, and is formed so as to cover the upper surface of the uppermost metal wiring AT of the wiring layer MT. The anti-reflection insulating film ARF is formed so as to cover the upper surface of the laminated film LM3 (TiN film TN), and it is desirable that the insulating film ARF is comprised of the silicon oxynitride film (SiON) formed, for example, by a plasma CVD method.

However, it is considered that the wiring layers M1 to M4 other than the uppermost layer are respectively formed by the laminated films LM1, the metal wirings A1 to A4, and the TiN films TN, each of which is part of the laminated film LM2. Herein, the laminated film LM2 is also formed by the TiN film TN and the silicon nitride film SN1.

The present embodiment is different from First Embodiment in the aforementioned point, and is similar thereto in other points, and hence like components will be denoted with like reference symbols and the description thereof will not be repeated. Each component described in First Embodiment may be added to the semiconductor device according to the present embodiment.

Subsequently, a method of manufacturing a semiconductor device according to one embodiment illustrated, for example, in FIG. 21 will be described, centering on a method of manufacturing the uppermost wiring layer MT, with reference to FIGS. 22 to 26.

Figure 22:
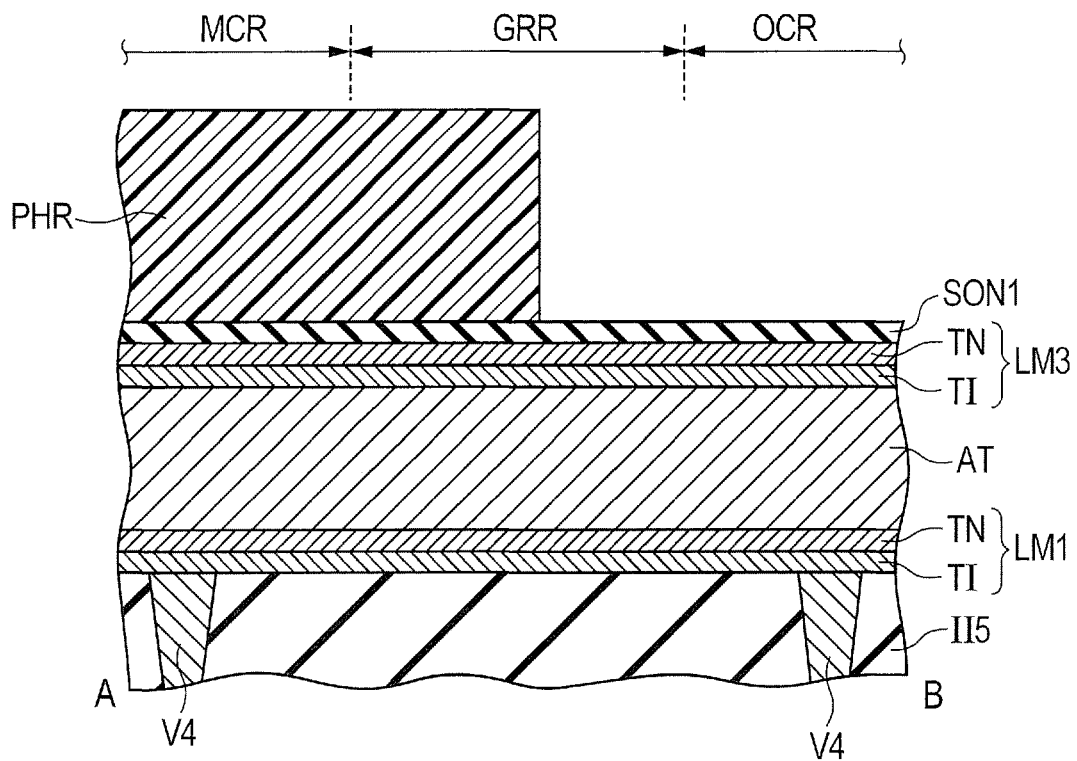
FIG. 22 is a schematic sectional view illustrating a first step of a method of manufacturing a semiconductor device in Second Embodiment.

With reference to FIG. 22, the interlayer insulating film II5, the via V4, the laminated film LM1, and the uppermost metal wiring AT are formed, similarly in FIG. 6. Herein, the laminated film LM1 and the uppermost metal wiring AT are formed over almost the whole main surface of the semiconductor substrate SUB. Subsequently, the laminated film LM3, in which the titanium film TI and the Tin film TN are laminated in this order, and the silicon oxynitride film SON1 formed by a plasma CVD method are laminated in this order over almost the whole main surface of the uppermost metal wiring AT. As an example, the titanium film TI, the TiN film TN, and the silicon oxynitride film SON1 are formed so as to have thicknesses of 2.5 nm, 23 nm, and 50 nm, respectively. The silicon oxynitride film SON1 is formed as the anti-reflection insulating film ARF sandwiched between the uppermost metal wiring AT and the TiN film TN as the conducting film over uppermost metal wiring TOA (see FIG. 26).

The laminated film LM3 is similar to the laminated film LM2 in FIG. 14 (comparative example) in that the titanium film TI, the TiN film TN, and the silicon oxynitride film SON1 are laminated in this order over the upper surface of the uppermost metal wiring AT, but herein the name of laminated film LM3, which is different from that in FIG. 14, is adopted for convenience.

Figure 23:
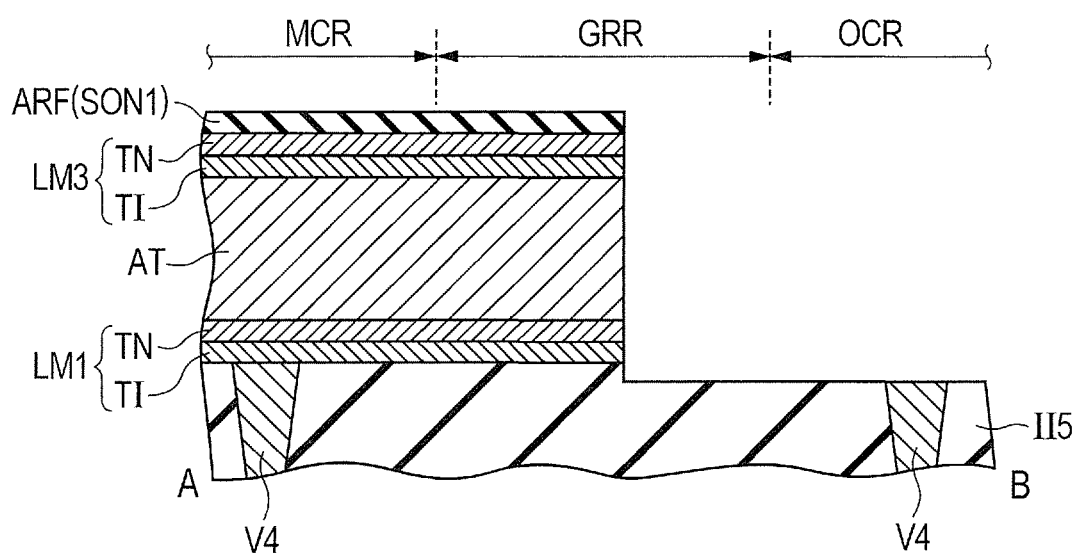
FIG. 23 is a schematic sectional view illustrating a second step of the method of manufacturing a semiconductor device in Second Embodiment.

Subsequently, the pattern of the photoresist PHR is formed similarly in FIG. 6. With reference to FIG. 23, the pattern of the uppermost metal wiring AT is formed in both the wiring structure region MCR and part of the guard ring formation region GRR by a normal etching technique, similarly in FIG. 7.

Figure 24:
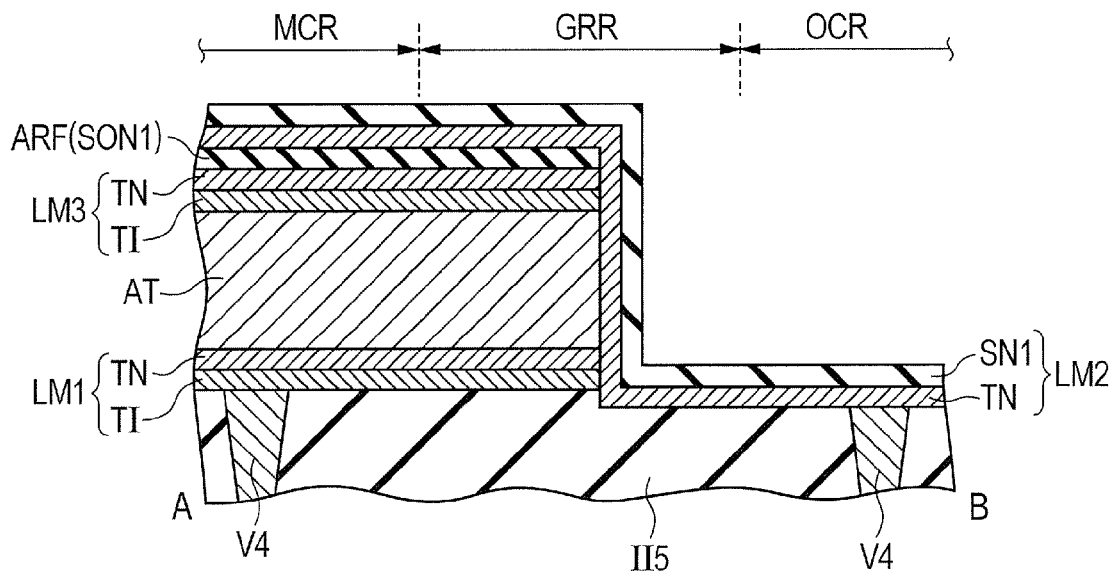
FIG. 24 is a schematic sectional view illustrating a third stop of the method of manufacturing a semiconductor device in Second Embodiment.
Figure 25:
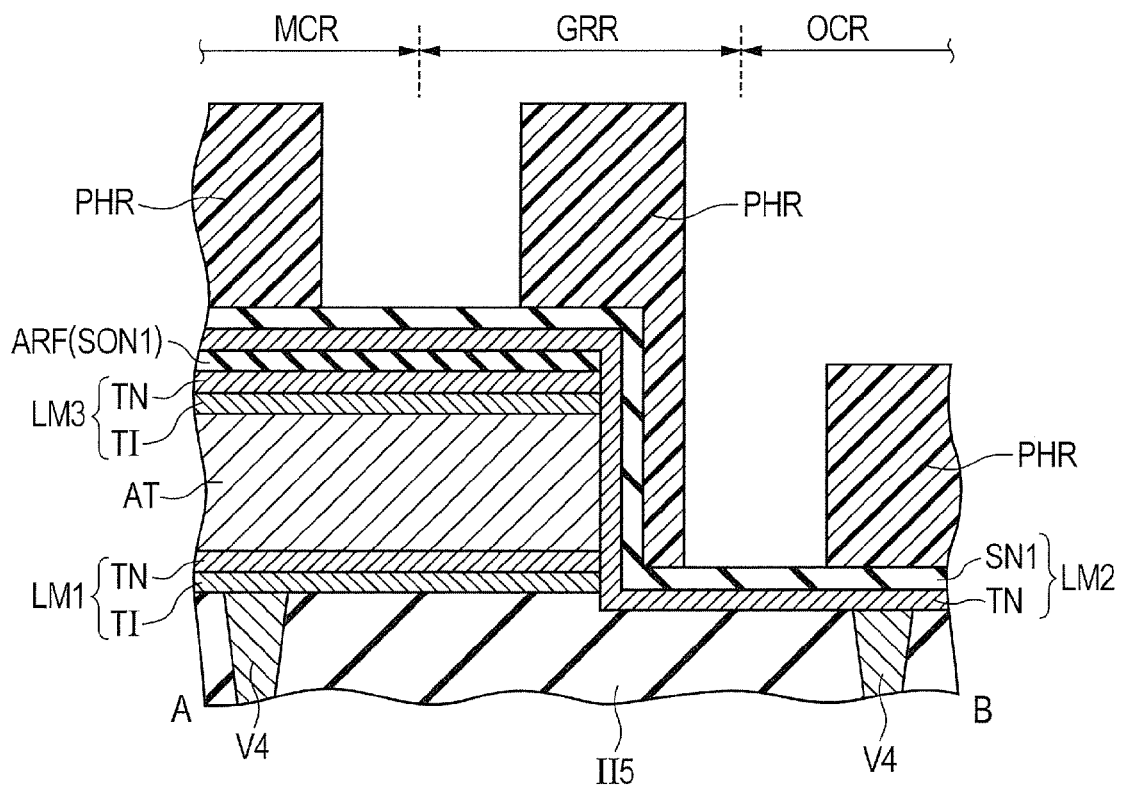
FIG. 25 is a schematic sectional view illustrating a fourth step of the method of manufacturing a semiconductor device in Second Embodiment.
Figure 26:
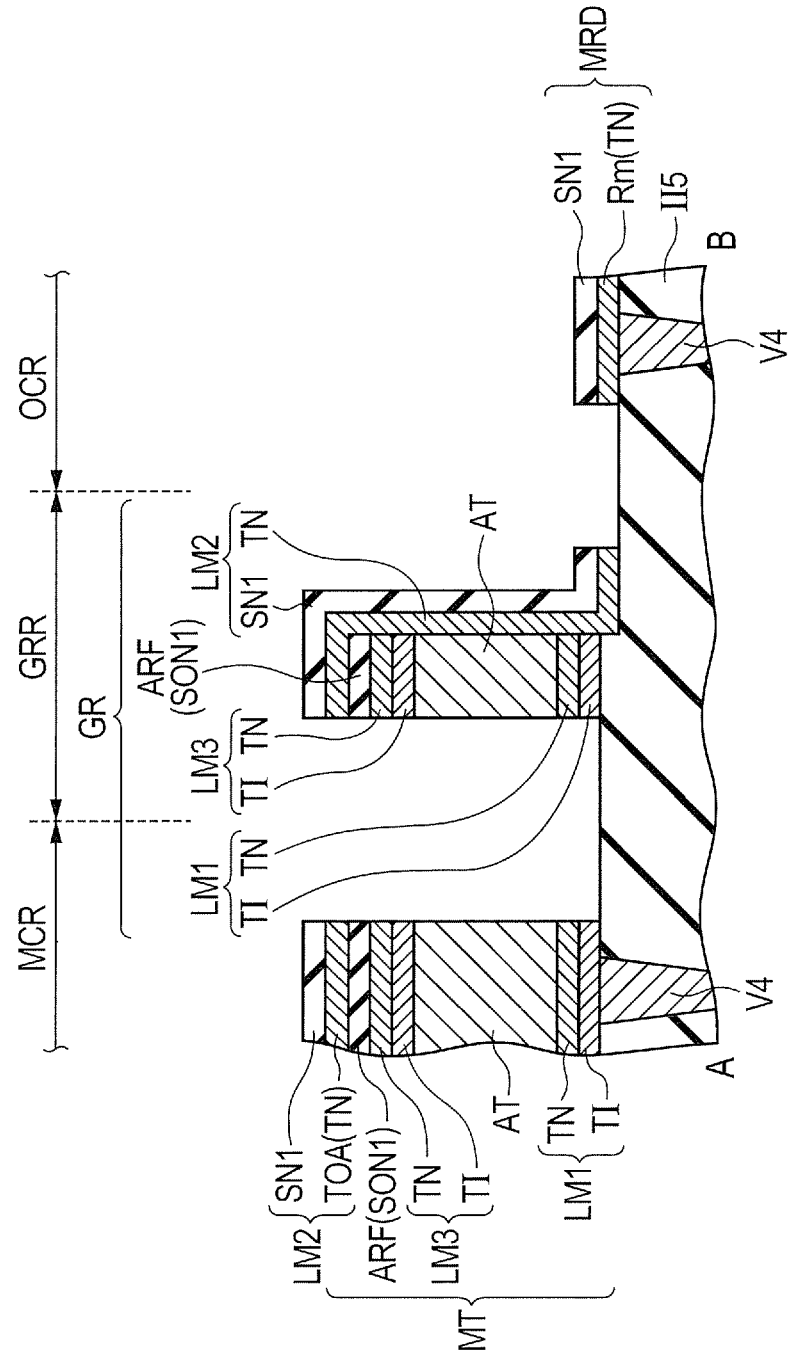
FIG. 26 is a schematic sectional view illustrating a fifth step of the method of manufacturing a semiconductor device in Second Embodiment.

With reference to FIGS. 24 to 26, a semiconductor device according to the present embodiment is formed by performing the processing basically similar to those in FIGS. 8 to 10 of First Embodiment. In the steps of FIGS. 24 to 26, however, the TiN film TN covering the upper and side surfaces of the uppermost metal wiring AT, as part of the laminated film LM2, is not required to be a thin film of TiN, and a thin film of tungsten, aluminum, chromium silicide ($CrSi_2$), or the like may be used instead of a thin film of TiN. The step of FIGS. 24 to 20 are different from those of steps of FIGS. 8 to 10 in this point.

As illustrated in FIG. 26, a laminated structure formed by the laminated film LM3 (titanium film TI and TiN film TN), the anti-reflection insulating film ARF, and the laminated film LM2 (TiN film TN and silicon nitride film SN1) is formed, of the wiring structure region MCR, in the region where the wiring layer MT is formed and the region where the guard ring GR is formed, so as to cover the upper surface of the uppermost metal wiring AT. The anti-reflection insulating film ARF is formed by patterning the silicon oxynitride film SON1.

Herein, it is considered that, (although the uppermost metal wiring MT includes the silicon oxynitride film SON1 as an insulating film), the uppermost wiring layer MT is comprised of the laminated film LM1, the uppermost metal wiring AT, the laminated film LM3, the silicon oxynitride film SON1 (anti-reflection insulating film ARF), and the TiN film TN of the laminated LM2. However, it is considered that the guard ring GR is a region where the laminated film LM1, the uppermost metal wiring AT, the laminated film LM3, the silicon oxynitride film SON1 (anti-reflection insulating film ARF), and the laminated film LM2 entirely combined.

Subsequently, operations and effects of the present embodiment will be described. The present embodiment has the following operations and effects in addition to those of First Embodiment.

In the present embodiment, because the anti-reflection insulating film ARF (silicon oxynitride film SON1) is formed so as to be sandwiched between the uppermost metal wiring AT and the conducting film over uppermost metal wiring TOA (TiN film TN) in the wiring layer MT, conduction of a current, such as a short-circuit between the uppermost metal wiring AT and the conducting film over uppermost metal wiring TOA (TN), can be suppressed.

Accordingly, the conducting film over uppermost metal wiring TOA (TiN film TN), which is the same layer as the metal resistive element layer Rm, is hardly influenced by the electrical resistance and the current of the uppermost metal wiring AT, and hence a phenomenon in which the resistance value of the metal resistive element layer Rm varies, the oscillation characteristic of the OCO circuit varies, or the like can be suppressed, thereby allowing stable oscillation characteristic of the OCO circuit to be secured.

As a result, it becomes possible to use, as the conducting film over uppermost metal wiring TOA that forms the laminated film LM2, a thin film of tungsten, aluminum, chromium silicide ($CrSi_2$), like, without being limited to a thin film TiN, thereby allowing a material to be selected from a further wide range. For example, aluminum has a higher conductivity than TiN, and hence the conductivity of the wiring layer MT can be further enhanced by using aluminum in a conducting part that forms the wiring layer. MT and the driving force of a multi-layer wiring structure can be further enhanced.

Reference Example

Figure 27:
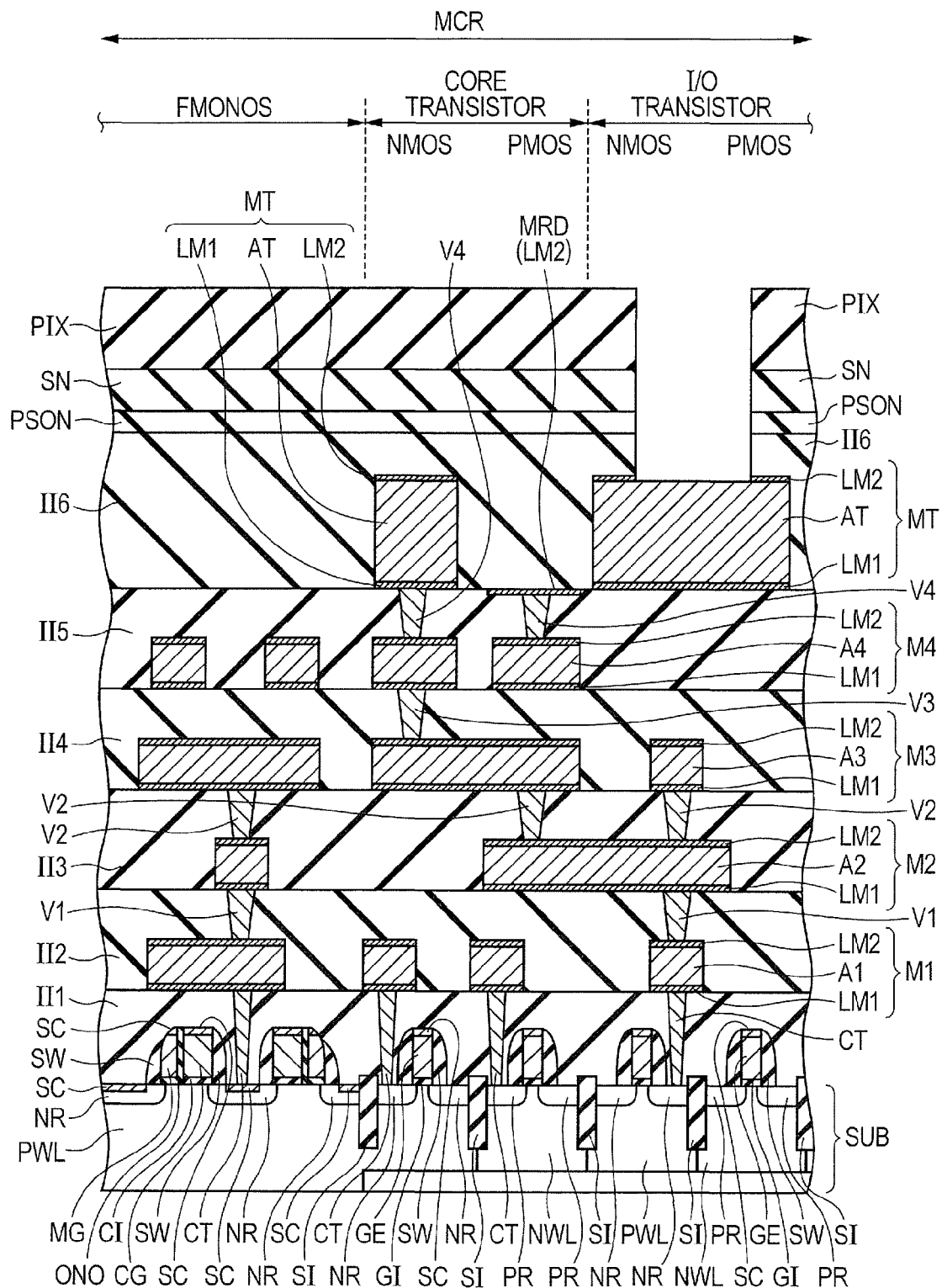
FIG. 27 is a schematic sectional view illustrating, as a reference example, a variation of the configuration of an integrated circuit and a multi-layer wiring structure that form the microcontroller product according to First Embodiment.
Figure 28:
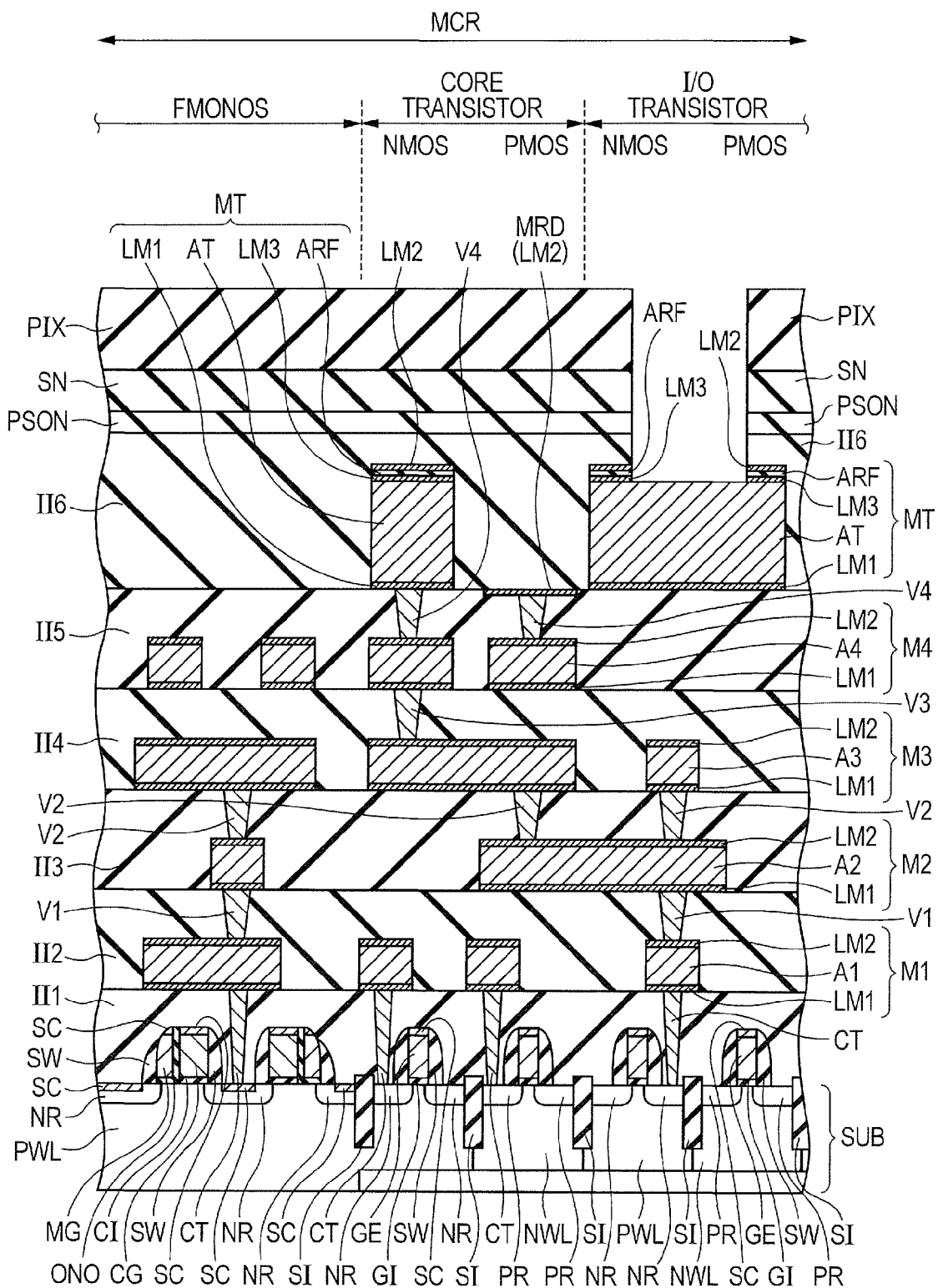
FIG. 28 is a schematic sectional view illustrating, as a reference example, a variation of the configuration of an integrated circuit and a multi-layer wiring structure that form the microcontroller product according to Second Embodiment.

In FIGS. 2 and 21, of the region where the core transistor is formed, the region where the metal resistive element MRD is arranged is formed with the upper surface of the interlayer insulating film II5 being deeply dug in the downward direction, in comparison with other regions. This is based on the same reason (over-etching) as the reason why, in FIG. 3, the upper surface of the interlayer insulating film II5 is deeply dug in the downward direction in the guard ring formation region GRR and the laminated film LM2 is arranged, in the oscillator region OCR, under the laminated film LM1 in the wiring structure region MCR. However, when an amount of the over-etching is extremely small, the upper surface of the interlayer insulating film II5 in the region where the metal resistive element MRD is arranged, of the region where the core transistor is formed, is formed at a height almost the same as that of the interlayer insulating film in other regions, as illustrated in FIGS. 27 and 28. Even in the aspect illustrated in FIGS. 27 and 28, the same operations and effects as those of the aforementioned embodiment can be obtained, as far as the metal resistive element MRD is the same layer as the laminated film LM2 covering the upper surface of the uppermost metal wiring AT.

The invention made by the present inventors has been specifically described above based on preferred embodiments; however, it is needless to say that the invention should not be limited to the preferred embodiments and various modifications may be made to the invention within a range not departing from the gist of the invention.

What is claimed is:

1. A semiconductor device comprising:
   a semiconductor substrate having a main surface;
   a wiring structure including a plurality of layers of metal wirings arranged over the main surface of the semiconductor substrate;
   a conducting film over an uppermost metal wiring formed so as to cover the upper surface of the uppermost metal wiring that is the uppermost layer of the metal wirings of the wiring structure; and
   a metal resistive element formed by the same layer as the conducting film over uppermost metal wiring,
   wherein the metal resistive element is arranged at a position lower than that of the conducting film over the uppermost metal wiring.

2. The semiconductor device according to claim 1 further comprising:
   an oscillator region arranged over the main surface so as to be located side by side with a wiring structure region where the wiring structure is arranged; and
   a guard ring region between the wiring structure region and the oscillator region.

3. The semiconductor device according to claim 1,
   wherein the metal resistive element is arranged to be spaced apart from the uppermost metal wiring.

4. A semiconductor device comprising:
   a semiconductor substrate having a main surface;
   a wiring structure including a plurality of layers of metal wirings arranged over the main surface of the semiconductor substrate;
   a conducting film over an uppermost metal wiring formed so as to cover the upper surface of the uppermost metal wiring that is the uppermost layer of the metal wirings of the wiring structure;
   a metal resistive element formed by the same layer as the conducting film over uppermost metal wiring; and
   an anti-reflection insulating film to be sandwiched between the uppermost metal wiring and the conducting film over uppermost metal wiring.

5. The semiconductor device according to claim 1,
   wherein the metal resistive element is formed by TiN.

6. A method of manufacturing a semiconductor device, comprising the steps of:
   providing a semiconductor device;
   forming a plurality of layers of metal wirings over a main surface of the semiconductor device;
   forming a conducting film extending from an upper surface of the uppermost metal wiring that is the uppermost layer of the metal wirings to an interlayer insulating film arranged in contact with a lower surface of the uppermost metal wiring; and
   patterning the conducting film to separate the conducting film into both a conducting film over uppermost metal wiring covering the upper surface of the uppermost metal wiring and a metal resistive element formed by the same layer as the conducting film over uppermost metal wiring.

7. The method of manufacturing a semiconductor device according to claim 6 further comprising the step of:
   forming an anti-reflection insulating film between the uppermost metal wiring and the conducting film over the uppermost metal wiring.

* * * * *